(12) United States Patent
Ikenaga et al.

(10) Patent No.: US 11,313,026 B2
(45) Date of Patent: Apr. 26, 2022

(54) METHOD OF MANUFACTURING DEPOSITION MASK, INTERMEDIATE PRODUCT TO WHICH DEPOSITION MASK IS ALLOCATED, AND DEPOSITION MASK

(71) Applicant: Dai Nippon Printing Co., Ltd., Tokyo (JP)

(72) Inventors: Chikao Ikenaga, Tokyo (JP); Takanori Maruoka, Tokyo (JP); Sachiyo Matsuura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/662,150

(22) Filed: Oct. 24, 2019

(65) Prior Publication Data

US 2020/0056279 A1 Feb. 20, 2020

Related U.S. Application Data

(63) Continuation of application No. 16/372,661, filed on Apr. 2, 2019, which is a continuation of application No. PCT/JP2017/032923, filed on Sep. 12, 2017.

(30) Foreign Application Priority Data

Oct. 7, 2016 (JP) .............................. JP2016-199420

(51) Int. Cl.
  *C23C 14/04* (2006.01)
  *C23F 1/28* (2006.01)
  (Continued)

(52) U.S. Cl.
  CPC ............ *C23C 14/042* (2013.01); *B05B 12/20* (2018.02); *B05C 21/005* (2013.01); *C23C 14/04* (2013.01);
  (Continued)

(58) Field of Classification Search
  CPC ................................................ C23C 14/042
  See application file for complete search history.

(56) References Cited

U.S. PATENT DOCUMENTS

2003/0101932 A1  6/2003  Kang
2003/0150384 A1  8/2003  Baude et al.
(Continued)

FOREIGN PATENT DOCUMENTS

CN    102492920 A    6/2012
CN    104838037 A    8/2015
(Continued)

OTHER PUBLICATIONS

Extended European Search Report (Application No. 17858164.1) dated May 12, 2020.
(Continued)

*Primary Examiner* — Christopher S Kessler
(74) *Attorney, Agent, or Firm* — Burr & Brown, PLLC

(57) ABSTRACT

A deposition mask in which deformation of long sides is restrained is manufactured. A manufacturing method of a deposition mask includes a step of preparing a metal plate; a processing step of processing the metal plate into an intermediate product comprising: a plurality of deposition mask portions each including a pair of long sides and a pair of short sides, and having a plurality of through-holes formed therein; and a support portion that surrounds the plurality of deposition mask portions, and is partially connected to the short sides of the plurality of deposition mask portions; and a separation step of separating the deposition mask portions from the support portion to obtain the deposition mask. In the intermediate product, the long sides of the deposition mask portions are not connected to the support portion.

11 Claims, 16 Drawing Sheets

(51) Int. Cl.
  *H05B 33/10* (2006.01)
  *H01L 51/50* (2006.01)
  *C23F 1/02* (2006.01)
  *C23C 14/24* (2006.01)
  *C23C 14/12* (2006.01)
  *B05C 21/00* (2006.01)
  *C30B 25/04* (2006.01)
  *C23C 16/04* (2006.01)
  *H05K 3/14* (2006.01)
  *B05B 12/20* (2018.01)
  *C22C 38/08* (2006.01)
  *H01L 51/00* (2006.01)
  *H01L 51/56* (2006.01)
  *B05D 1/32* (2006.01)

(52) U.S. Cl.
  CPC ............ *C23C 14/12* (2013.01); *C23C 14/243* (2013.01); *C23C 16/04* (2013.01); *C23F 1/02* (2013.01); *C23F 1/28* (2013.01); *C30B 25/04* (2013.01); *H01L 51/50* (2013.01); *H05B 33/10* (2013.01); *H05K 3/143* (2013.01); *B05D 1/32* (2013.01); *C22C 38/08* (2013.01); *C23C 14/24* (2013.01); *H01L 51/0011* (2013.01); *H01L 51/56* (2013.01)

(56) References Cited

U.S. PATENT DOCUMENTS

| | | |
|---|---|---|
| 2004/0135498 A1 | 7/2004 | Takanosu et al. |
| 2012/0081858 A1 | 4/2012 | Ganesan et al. |
| 2013/0040047 A1 | 2/2013 | Karaki |
| 2015/0013601 A1 | 1/2015 | Lee |
| 2015/0037928 A1 | 2/2015 | Hirobe et al. |
| 2015/0194762 A1 | 7/2015 | Fukuda et al. |
| 2016/0144393 A1 | 5/2016 | Kwon |
| 2016/0208392 A1 | 7/2016 | Ikenaga et al. |
| 2017/0141315 A1 | 5/2017 | Ikenaga |
| 2018/0023182 A1 | 1/2018 | Ikenaga et al. |
| 2018/0195177 A1 | 7/2018 | Ikenaga et al. |
| 2021/0207258 A1 | 7/2021 | Obata et al. |

FOREIGN PATENT DOCUMENTS

| | | | |
|---|---|---|---|
| JP | 5455059 B | * | 3/2014 |
| JP | 2015-055007 A1 | | 3/2015 |
| JP | 2016-148111 A1 | | 8/2016 |
| KR | 10-2012-0085042 A | | 7/2012 |
| KR | 10-2015-0063442 A | | 6/2015 |
| KR | 10-2016-0062281 A | | 6/2016 |
| WO | 2015/174269 A1 | | 11/2015 |

OTHER PUBLICATIONS

U.S. Office Action (U.S. Appl. No. 16/372,661) dated Nov. 10, 2020.
U.S. Office Action (U.S. Appl. No. 16/372,661) dated Jul. 19, 2021.
Korean Office Action (Application No. 10-2019-7006625) dated Oct. 18, 2021 (with English translation).
International Search Report and Written Opinion (Application No. PCT/JP2017/032923) dated Nov. 21, 2017.
English translation of International Preliminary Report on Patentability (Chapter I) (Application No. PCT/JP2017/032923) dated Apr. 18, 2019, 7 pages.
Chinese Office Action (Application No. 201710897048.0) dated Jun. 13, 2019.

* cited by examiner

METHOD OF MANUFACTURING DEPOSITION MASK, INTERMEDIATE PRODUCT TO WHICH DEPOSITION MASK IS ALLOCATED, AND DEPOSITION MASK

CROSS-REFERENCE TO RELATED APPLICATIONS

This application is a continuation application of U.S. application Ser. No. 16/372,661 filed Apr. 2, 2019, which is a continuation application of International Application No. PCT/JP2017/32923, filed on Sep. 12, 2017, which claims the benefit of priority from Japanese Patent Application No. 2016-199420, filed on Oct. 7, 2016. The entire contents of these applications are incorporated herein by reference.

BACKGROUND

Field

The embodiment of the disclosure relates to a deposition mask and a manufacturing method of a deposition mask. In addition, the embodiment of the disclosure relates to an intermediate product for producing a deposition mask.

Background Art

A display device used in a portable device such as a smart phone and a tablet PC is required to have high fineness, e.g., a pixel density of not less than 400 ppi. In addition, there is increasing demand that the portable device is applicable in the full high-definitions reference. In this case, the pixel density of the display device needs to be not less than 800 ppi, for example.

An organic EL display device draws attention because of its excellent responsibility and low power consumption. A known method for forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to perform a deposition step in which an organic material is deposited on the substrate. Thus, pixels containing an organic material can be formed on the substrate in a pattern corresponding to the pattern of the through-holes of deposition mask.

In the deposition step, the deposition mask is fixed on a frame having a predetermined rigidity. For example, when the deposition mask has a pair of long sides and a pair of short sides, the deposition mask is fixed on the frame, such that the deposition mask is pulled in the long side direction. Thus, warp of the deposition mask is prevented, while a dimensional precision and a positional precision of pixels can be increased.

As disclosed in JP2015-55007A, for example, a method of forming through-holes in a metal plate by etching using photolithographic technique is known as a manufacturing method of a deposition mask. For example, a first resist pattern is formed on a first surface of a metal plate by an exposure/development process. In addition, a second resist pattern is formed on a second surface of the metal plate by an exposure/development process. Then, an area of the first surface of the metal plate, which is not covered with the resist pattern, is etched to form first openings in the first surface of the metal plate. Thereafter, an area of the second surface of the metal plate, which is not covered with the second resist pattern is etched to form second openings in the second surface of the metal plate. At this time, by etching the areas such that each first opening and each second opening communicate with each other, through-holes passing through the metal plate can be formed.

As a method of efficiently manufacturing deposition masks, there is known a method in which a metal plate having an area corresponding to a plurality of deposition masks is prepared, then a plurality of through-holes to be formed in the deposition masks are formed in the metal plate, and thereafter the respective deposition masks are taken out from the metal plate. For example, in JP2015-55007A, deposition masks are taken out from a metal plate by cutting the metal plate along break lines. In JP2015-55007A, the break lines are perforated lines formed in the metal plate in a pattern corresponding to the long sides and the short sides of deposition the masks.

SUMMARY

When a perforated line is broken, there is a possibility that a deposition mask is pulled from a metal plate so that the metal plate is deformed. For example, a long side of the deposition mask may have deformation such as a wavy shape. As a result, a dimensional precision and a positional precision of a deposition material, which adheres to a substrate through a through-hole positioned in the vicinity of the long side of the deposition mask, are decreased.

The object of the embodiment of the disclosure is to provide a manufacturing method of a deposition mask, which is capable of effectively solving such a problem.

The first embodiment of the disclosure is a manufacturing method of a deposition mask including a pair of long sides and a pair of short sides, and having a plurality of through-holes formed therein, the manufacturing method comprising: a step of preparing a metal plate; a processing step of processing the metal plate into an intermediate product comprising: a plurality of deposition mask portions each including a pair of long sides and a pair of short sides, and having a plurality of through-holes formed therein; and a support portion that surrounds the plurality of deposition mask portions, and is partially connected to the short sides of the plurality of deposition mask portions; and a separation step of separating the deposition mask portions from the support portion to obtain the deposition mask; wherein, in the intermediate product, the long sides of the deposition mask portions are not connected to the support portion.

The second embodiment of the disclosure is a manufacturing method of a deposition mask including a pair of long sides and a pair of short sides, and having a plurality of through-holes formed therein, the manufacturing method comprising: a step of preparing a metal plate; a processing step of processing the metal plate into an intermediate product comprising: a plurality of deposition mask portions each including a pair of long sides and a pair of short sides, and having a plurality of through-holes formed therein; and a support portion that surrounds the plurality of deposition mask portions, and is partially connected to the plurality of deposition mask portions; and a separation step of separating the deposition mask portions from the support portion to obtain the deposition mask; wherein, in the intermediate product, a ratio of a part of the long side of the deposition mask portion, which part is connected to the support portion, is smaller than a ratio of a part of the short side of the deposition mask portion, which part is connected to the support portion.

The third embodiment of the disclosure is the manufacturing method of a deposition mask according to the second embodiment of the disclosure, the ratio of the part of the long side of the deposition mask portion, which part is connected to the support portion, may be calculated by dividing a sum of widths of portions of the long side, which portions are connected to the support portion, by a length of the long side, and the ratio of the part of the short side of the deposition mask portion, which part is connected to the support portion, may be calculated by dividing a sum of widths of portions of the short side, which portions are connected to the support portion, by a length of the short side.

The fourth embodiment of the disclosure is the manufacturing method of a deposition mask according to the second embodiment of the disclosure, the ratio of the part of the long side of the deposition mask portion, which part is connected to the support portion, may be calculated by dividing the number of portions of the long side, which portions are connected to the support portion, by a length of the long side, and the ratio of the part of the short side of the deposition mask portion, which part is connected to the support portion, may be calculated by dividing the number of portions of the short side, which portions are connected to the support portion, by a length of the short side.

The fifth embodiment of the disclosure is the manufacturing method of a deposition mask according to the second embodiment of the disclosure, preferably, an area of the long side of the deposition mask portion, which area is overlapped with the through-holes when the long side is seen along a width direction of the intermediate product, is not connected to the support portion. More preferably, the entire area of the long side of the deposition mask portion is not connected to the support portion.

The sixth embodiment of the disclosure is the manufacturing method of a deposition mask according to any one of the first embodiment to the fifth embodiment of the disclosure, in the intermediate product, the short side of the deposition mask portion may include a plurality of projections projecting toward the support portion so as to be connected to the support portion.

The seventh embodiment of the disclosure is the manufacturing method of a deposition mask according to any one of the first embodiment to the sixth embodiment of the disclosure, in the intermediate product, the plurality of deposition mask portions may be aligned in a direction intersecting with the long sides, and the support portion may not exist between the long sides of the adjacent two deposition mask portions.

The eighth embodiment of the disclosure is the manufacturing method of a deposition mask according to any one of the first embodiment to the seventh embodiment of the disclosure, the processing step may include a step of etching the metal plate to form the through-holes, and a gap between the long side of the deposition mask portion and the support portion.

The ninth embodiment of the disclosure is the manufacturing method of a deposition mask according to any one of the first embodiment to the eighth embodiment of the disclosure, the metal plate may be processed while the metal plate is being conveyed along a direction of the long side of the deposition mask portion.

The tenth embodiment of the disclosure is the manufacturing method of a deposition mask according to any one of the first embodiment to the ninth embodiment of the disclosure, the deposition mask portion may be separated from the support portion by breaking the part of the short side of the deposition mask portion, which part is connected to the support portion.

The eleventh embodiment of the disclosure is the manufacturing method of a deposition mask according to any one of the first embodiment to the tenth embodiment of the disclosure, a thickness of the metal plate may be not more than 50 μm.

The twelfth embodiment of the disclosure is an intermediate product having a plate-like shape and made of metal, to which a deposition mask including a pair of long sides and a pair of short sides, and having a plurality of through-holes formed therein is allocated, the intermediate product comprising: a deposition mask portion including a pair of long sides and a pair of short sides, and having a plurality of through-holes formed therein; and a support portion that surrounds the deposition mask portion, and is partially connected to the short sides of the deposition mask portion; wherein the long sides of the deposition mask portion are not connected to the support portion.

The thirteenth embodiment of the disclosure is an intermediate product having a plate-like shape and made of metal, to which a deposition mask including a pair of long sides and a pair of short sides, and having a plurality of through-holes formed therein is allocated, the intermediate product comprising: a deposition mask portion including a pair of long sides and a pair of short sides, and having a plurality of through-holes formed therein; and a support portion that surrounds the deposition mask portion, and is partially connected to the deposition mask portion; wherein a ratio of a part of the long side of the deposition mask portion, which part is connected to the support portion, is smaller than a ratio of a part of the short side of the deposition mask portion, which part is connected to the support portion.

The fourteenth embodiment of the disclosure is the intermediate product having a plate-like shape and made of metal according to the thirteenth embodiment of the disclosure, the ratio of the part of the long side of the deposition mask portion, which part is connected to the support portion, may be calculated by dividing a sum of widths of portions of the long side, which portions are connected to the support portion, by a length of the long side, and the ratio of the part of the short side of the deposition mask portion, which part is connected to the support portion, may be calculated by dividing a sum of width of portions of the short side, which portions are connected to the support portion, by a length of the short side.

The fifteenth embodiment of the disclosure is the intermediate product having a plate-like shape and made of metal according to the thirteenth embodiment of the disclosure, the ratio of the part of the long side of the deposition mask portion, which part is connected to the support portion, may be calculated by dividing the number of portions of the long side, which portions are connected to the support portion, by a length of the long side, and the ratio of the part of the short side of the deposition mask portion, which part is connected to the support portion, may be calculated by dividing the number of portions of the short side, which portions are connected to the support portion, by a length of the short side.

The sixteenth embodiment of the disclosure is the intermediate product having a plate-like shape and made of metal according to the thirteenth embodiment of the disclosure, preferably, an area of the long side of the deposition mask portion, which area is overlapped with the through-holes when the long side is seen along a width direction of the intermediate product, is not connected to the support portion. More preferably, the entire area of the long side of the deposition mask portion is not connected to the support portion.

The seventeenth embodiment of the disclosure is the intermediate product having a plate-like shape and made of metal according to any one of the twelfth embodiment to the sixteenth embodiment, the short side of the deposition mask portion may include a plurality of projections projecting toward the support portion so as to be connected to the support portion.

The eighteenth embodiment of the disclosure is the intermediate product having a plate-like shape and made of metal according to any one of the twelfth embodiment to the seventeenth embodiment, thicknesses of the deposition mask portion and the support portion may be not more than 50 μm.

The nineteenth embodiment of the disclosure is the intermediate product having a plate-like shape and made of metal according to any one of the twelfth embodiment to the eighteenth embodiment, a plurality of the deposition mask portions may be aligned in a direction intersecting with the long sides, and the support portion may not exist between the long sides of the adjacent two deposition mask portions.

The twentieth embodiment of the disclosure is a deposition mask comprising: a base member having a plate-like shape and made of metal, the base member including a pair of long sides and a pair of short sides; and a plurality of through-holes formed in the base member; wherein a broken-out surface partially exists on the short side of the base member, while no broken-out surface exists on the long side of the base member.

The twenty-first embodiment of the disclosure is a deposition mask comprising: a base member having a plate-like shape and made of metal, the base member including a pair of long sides and a pair of short sides; and a plurality of through-holes formed in the base member; wherein a ratio of a broken-out surface in the long side of the base member is smaller than a ratio of a broken-out surface in the short side of the base member.

The twenty-second embodiment of the disclosure is the deposition mask according to the twenty-first embodiment of the disclosure, the ratio of the broken-out surface in the long side of the base member may be calculated by dividing a sum of widths of the broken-out surfaces present in the long side by a length of the long side, and the ratio of the broken-out surface in the short side of the base member may be calculated by dividing a sum of widths of the broken-out surfaces present in the short side by a length of the short side.

The twenty-third embodiment of the disclosure is the deposition mask according to the twenty-first embodiment of the disclosure, the ratio of the broken-out surface in the long side of the base member may be calculated by dividing the number of the broken-out surfaces present in the long side by a length of the long side, and the ratio of the broken-out surface in the short side of the base member may be calculated by dividing the number of the broken-out surfaces present in the short side by a length of the short side.

The twenty-fourth embodiment of the disclosure is the deposition mask according to the twenty-first embodiment of the disclosure, preferably, the broken-out surface does not exist in an area that is overlapped with the through-holes when the long side is seen along a width direction of the deposition mask. More preferably, no broken-out surface exists over the entire area of the long side of the base member.

The twenty-fifth embodiment of the disclosure is the deposition mask according to any one of the twentieth embodiment to the twenty-fourth embodiment of the disclosure, the short side of the base member may include a plurality of projections each projecting outward and having the broken-out surface.

The twenty-sixth embodiment of the disclosure is the deposition mask according to any one of the twentieth embodiment to the twenty-fifth embodiment of the disclosure, a minimum distance from the long side of the base member up to the through-holes in a plane direction of the base member may be not more than 50 μm.

The twenty-seventh embodiment of the disclosure is the deposition mask according to any one of the twentieth embodiment to the twenty-sixth embodiment of the disclosure, the base member may have a first surface that faces a substrate to which a deposition material having passed through the through-holes adheres, and a second surface positioned oppositely to the first surface, and the long side of the base member may have a sectional shape that projects most outside at a part meeting the first surface.

The twenty-eighth embodiment of the disclosure is the deposition mask according to any one of the twentieth embodiment to the twenty-seventh embodiment of the disclosure, a thickness of the base member may be not more than 50 μm.

According to the embodiment of the disclosure, a deposition mask in which deformation of long sides is restrained can be manufactured.

DETAILED DESCRIPTION

Figure 1:
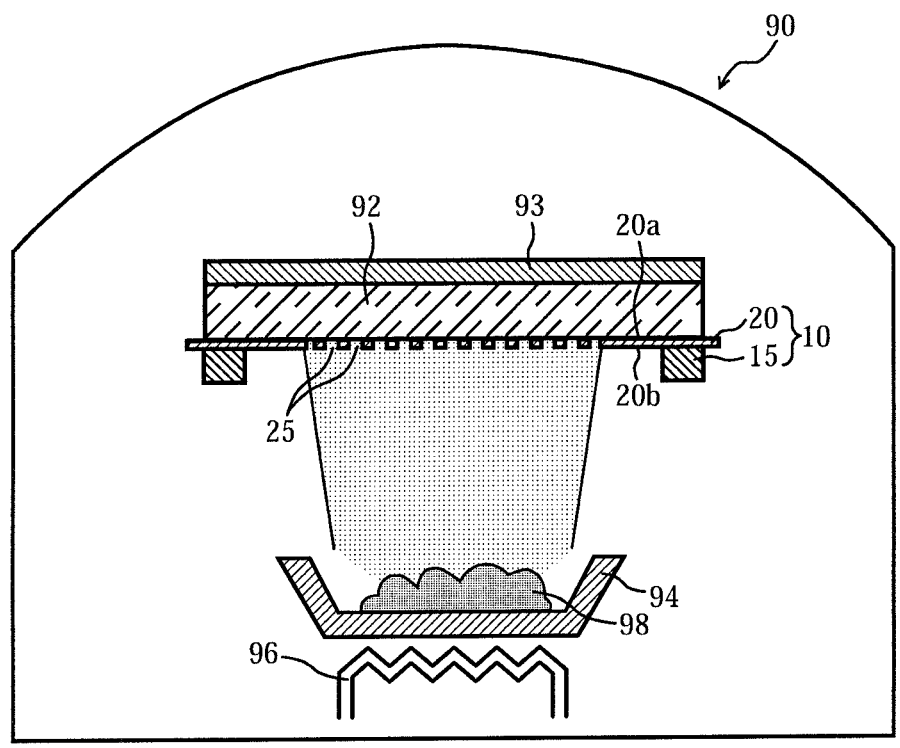
FIG. 1 is a sectional view showing a deposition apparatus comprising a deposition mask apparatus according to an embodiment of the disclosure.

An embodiment of the disclosure will be described herebelow with reference to the drawings. In the drawings attached to the specification, a scale dimension, an aspect ratio and so on are changed and exaggerated from the actual ones, for the convenience of easiness in illustration and understanding.

FIGS. 1 to 22 are views for describing an embodiment of the disclosure. In the below embodiment and the modification example, a manufacturing method of a deposition mask, which is used for patterning an organic material on a substrate in a desired pattern when an organic EL display device is manufactured, is described by way of example. However, not limited thereto, the disclosure can be applied to a manufacturing method for a deposition mask for various uses.

In this specification, terms "plate", "sheet" and "film" are not differentiated from one another based only on the difference of terms. For example, the "plate" is a concept including a member that can be referred to as sheet or film.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "orthogonal", "same", "similar" etc., are not limited to their strict definitions, but construed to include a range capable of exerting a similar function.

(Deposition Apparatus)

Firstly, a deposition apparatus 90 that performs a deposition process in which a deposition material is deposited on an object is described with reference to FIG. 1. As shown in FIG. 1, the deposition apparatus 90 includes therein a deposition source (e.g., crucible 94), a heater 96, and a deposition mask apparatus 10. The deposition apparatus 90 further has exhaust means for exhausting an inside of the deposition apparatus 90 into a vacuum atmosphere. The crucible 94 accommodates a deposition material 98 such as an organic luminescence material. The heater 96 heats the crucible 94 to evaporate the deposition material 98 under vacuum atmosphere. The deposition mask apparatus 10 is disposed oppositely to the crucible 94.

(Deposition Mask Apparatus)

Herebelow, the deposition mask apparatus 10 is described. As shown in FIG. 1, the deposition mask apparatus 10 includes a deposition mask 20, and a frame 15 supporting the deposition mask 20. The frame 15 supports the deposition mask 20 in such a manner that the deposition mask 20 is tensed in its plane direction, in order that the deposition mask 20 is not warped. As shown in FIG. 1, the deposition mask apparatus 10 is disposed in the deposition apparatus 90 such that the deposition mask 20 faces a substrate to which the deposition material 98 is to be deposited, such as an organic EL substrate 92. In the description below, a surface of the deposition mask 20, which is on the side of the organic EL substrate 92, is referred to as a first surface 20a, and a surface positioned oppositely to the first surface 20a is referred to as a second surface 20b.

As shown in FIG. 1, the deposition mask apparatus 10 may have a magnet 93 located on a surface of the organic EL substrate 93, which is disposed oppositely to the deposition mask 20. Due to the provision of the magnet 93, the deposition mask 20 can be drawn toward the magnet 93 by a magnetic force, so that the deposition mask 20 can be brought into tight contact with the organic EL substrate 92.

Figure 3:
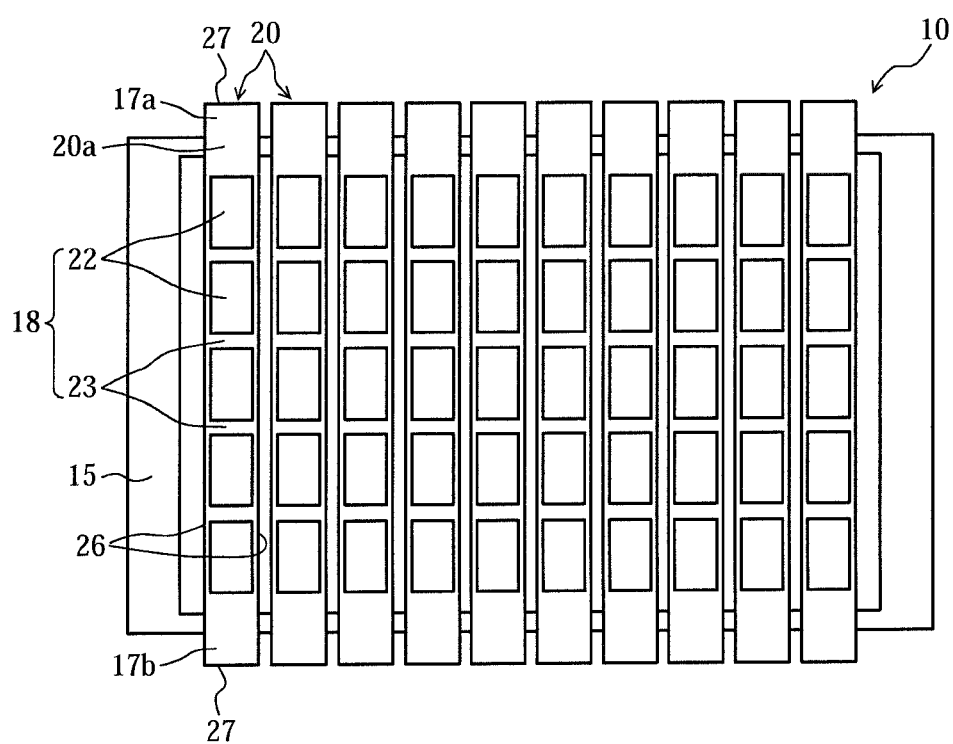
FIG. 3 is a plan view showing the deposition mask apparatus according to the embodiment of the disclosure.

FIG. 3 is a plan view of the deposition mask apparatus 10, seen from the side of the first surface 20a of the deposition mask 20. As shown in FIG. 3, the deposition mask apparatus 10 includes a plurality of deposition masks 20. Each deposition mask 20 includes a pair of long sides 26 and a pair of short sides 27, and has a rectangular shape, for example. Each deposition mask 20 is fixed on the frame 15 by spot welding, for example, at the pair of short sides 27 or a portion near thereto.

The deposition mask 20 includes a base member having a plate-like shape and made of metal, in which a plurality of through-holes 25 passing through the deposition mask 20 are formed. The deposition material 98, which has evaporated from the crucible 94 to reach the deposition mask apparatus 10, passes through the through-holes 25 of the deposition mask 20 to adhere to the organic EL substrate 92. Thus, the organic material 98 can be deposited on the surface of the organic EL substrate 92 in a desired pattern corresponding to the positions of the through-holes 25 of the deposition mask.

Figure 2:
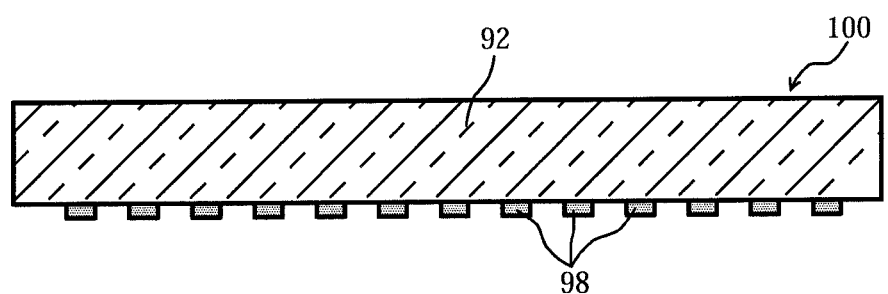
FIG. 2 is a sectional view showing an organic EL display device manufactured by using the deposition mask apparatus shown in FIG. 1.

FIG. 2 is a sectional view showing an organic EL display device 100 manufactured by using the deposition apparatus of FIG. 1. The organic EL display device 100 includes the organic EL substrate 92, and pixels containing the patterned deposition material 98.

When colored display by a plurality of colors is desired, the deposition apparatuses 90 provided with deposition masks corresponding to respective colors are respectively prepared, and the organic EL substrate 92 is put into the respective deposition apparatuses 90 in sequence. Thus, for example an organic luminescence material for red color, an organic luminescence material for green color, and an organic luminescence material for blue color can be deposited onto the organic EL substrate 92 in sequence.

The deposition process is sometimes performed inside the deposition apparatus 90 in a high-temperature atmosphere. Thus, during the deposition process, the deposition masks 20, the frame 15 and the organic EL substrate 92, which are held inside the deposition apparatus 90, are also heated. At this time, each of deposition mask 20, the frame 15 and the organic EL substrate 92 develop dimensional change behaviors based on their respective thermal expansion coefficients. In this case, when the thermal expansion coefficients of the deposition mask 20, the frame 15 and the organic EL substrate 92 largely differ from one another, positioning displacement occurs because of the difference in dimensional change. As a result, the dimensional precision and the positional precision of the deposition material to be adhered to the organic EL substrate 92 lower.

In order to avoid this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel can be used as a main material of the deposition mask 20 and the frame 15. For example, an iron alloy containing not less than 30% by mass and not more than 54% by mass of nickel can be used as a material of the substrate constituting the deposition masks 20. Concrete examples of an iron alloy containing nickel may be an invar material containing not less than 34% by mass and not more than 38% by mass of nickel, a super invar material containing cobalt in addition to not less than 30% by mass and not more than 34% by mass of nickel, or a low thermal expansion Fe—Ni based plated alloy containing not less than 38% by mass and not more than 54% by mass of nickel.

During the deposition step, if the deposition mask 20, the frame 15 and the organic EL substrate 92 do not reach high temperatures, it is not particularly necessary that the thermal expansion coefficients of the deposition mask 20 and the frame 15 are equivalent to the thermal expansion coefficient of the organic EL substrate 92. In this case, a material other than the aforementioned iron alloy can be used as a material for forming the deposition mask 20. For example, it is possible to use an iron alloy other than the iron alloy containing nickel, such as an iron alloy containing chrome. As an iron alloy containing chrome, an iron alloy that is so-called stainless can be used, for example. In addition, it is possible to use alloy other than an iron alloy, such as nickel, or nickel-cobalt alloy.

(Deposition Mask)

Next, the deposition mask 20 is described in detail. As shown in FIG. 3, the deposition mask 20 includes a pair of ear portions (first ear portion 17a and second ear portion 17b) having the pair of short sides 27 of the deposition mask, and an intermediate portion located between the pair of ear portions 17a, 17b.

(Ear Portion)

Firstly, the ear portion 17a, 17b is described in detail. The ear portion 17a, 17b is a part of the deposition mask 20, which is fixed to the frame 15. In this embodiment, the ear portion 17a, 17b is integrally formed with the intermediate portion 18. However, the ear portion 17a, 17b may be formed by a member different from the intermediate portion 18. In this case, the ear portion 17a, 17b is joined to the intermediate portion 18 by welding, for example.

(Intermediate Portion)

Next, the intermediate portion 18 is described. The intermediate portion 18 includes at least one effective area 22 in which through-holes 25 extending from the first surface 20a to reach the second surface 20b are formed, and a surrounding area 23 around the effective area 22. The effective area 22 is an area of the deposition mask 20, which faces a display area of the organic EL substrate 92.

In the example shown in FIG. 3, the intermediate portion 18 includes a plurality of effective areas 22 that are arranged at predetermined intervals along the long sides 26 of the deposition mask 20. One effective area 22 corresponds to a display area of one organic EL display device 100. Thus, the deposition mask apparatus 10 shown in FIG. 1 enables a multifaceted deposition of the organic EL display devices 100.

As shown in FIG. 3, the effective area 22 has, for example, a profile of a substantially quadrangular shape in plan view, more precisely, a substantially rectangular shape in plan view. Although not shown, each effective area 22 can have profiles of different shapes depending on a shape of the display area of the organic EL substrate 92. For example, each effective area 22 may have a circular profile.

Figure 4:
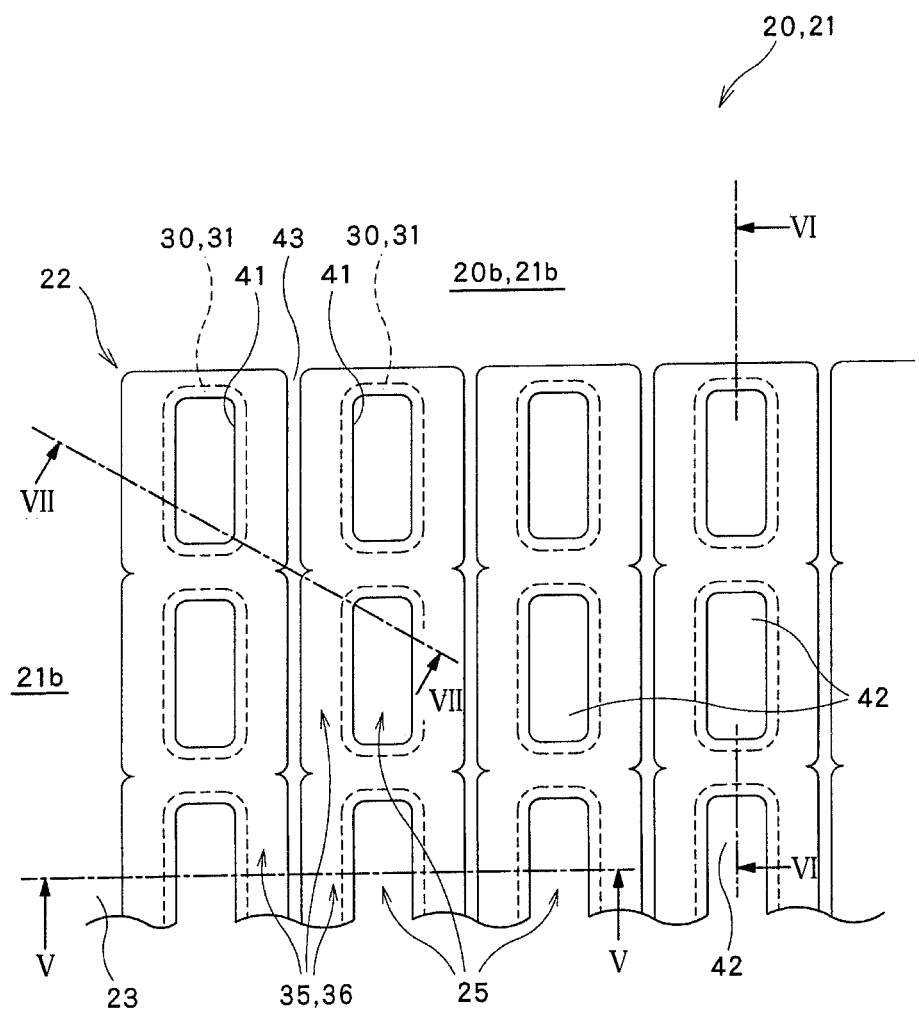
FIG. 4 is a partial plan view showing effective areas of the deposition mask shown in FIG. 3.
Figure 5:
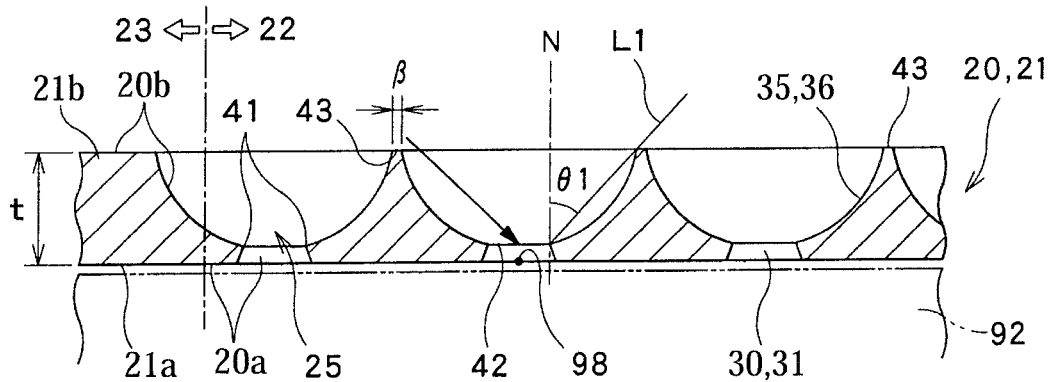
FIG. 5 is a sectional view along the V-V line in FIG. 4.
Figure 6:
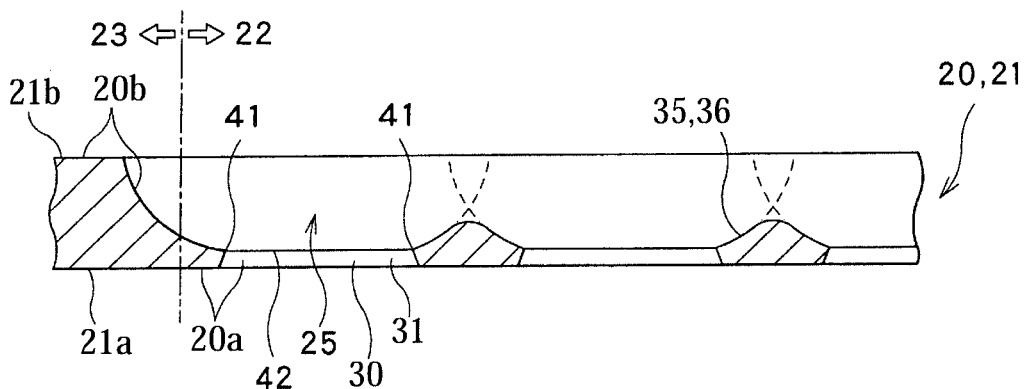
FIG. 6 is a sectional view along the VI-VI line in FIG. 4.
Figure 7:
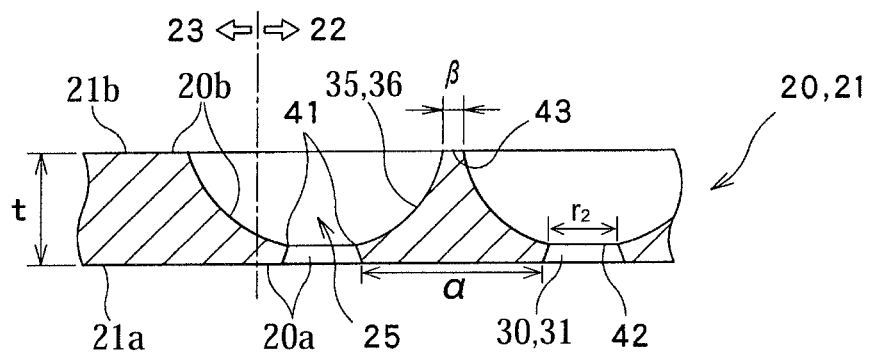
FIG. 7 is a sectional view along the VII-VII line in FIG. 4.

Hereinbelow, the effective area 22 is described in detail. FIG. 4 is an enlarged view showing the effective areas 22 from the side of the second surface 20b of the deposition mask 20. As shown in FIG. 4, in the illustrated example, the plurality of through-holes 25 formed in each effective area 22 are arranged in the effective area 22 at predetermined pitches along two directions orthogonal to each other. An example of the through-hole 25 is described in further detail with reference mainly to FIGS. 5 to 7. FIGS. 5 to 7 are sectional views along the V-V direction to VII-VII direction of the effective area 22 of FIG. 4.

As shown in FIGS. 5 to 7, the plurality of through-holes 25 pass through the deposition mask 20 from the first surface 20a, which is one side along a normal direction N of the deposition mask 20, to the second surface 20b, which is the other side along the normal direction N of the deposition mask 20. In the illustrated example, as described in detail later, first recesses 30 are formed by etching in the first surface 21a of the base member 21, which serves as the one side in the normal direction N of the deposition mask 20, and second recesses 35 are formed in the second surface 21b of the base member 21, which serves as the other side in the normal direction N of the deposition mask 20. Each of the first recesses 30 is connected to each of the second recesses 35, so that the second recess 35 and the first recess 30 are formed to communicate with each other. Each through-hole 25 is composed of the second recess 35 and the first recess 30 connected to the second recess 35.

As shown in FIGS. 5 to 7, an opening area of each second recess 35, in a cross-section along a plate plane of the deposition mask 20 at each position along the normal direction N of the deposition mask, gradually decreases from the side of the second surface 20b of the deposition mask 20 toward the side of the first surface 20a thereof. Similarly, an opening area of each first recess 30, in a cross-section along the plate plane of the deposition mask 20 at each position along the normal direction N of the deposition mask, gradually decreases from the side of the first surface 20a of the deposition mask 20 toward the side of the second surface 20b thereof.

As shown in FIGS. 5 to 7, a wall surface 31 of the first recess 20 and a wall surface 36 of the second recess 35 are connected via a circumferential connection portion 41. The connection portion 41 is defined by a ridge line of a bulging part where the wall surface 31 of the first recess 30, which is inclined with respect to the normal direction N of the deposition mask 20, and the wall surface 36 of the second recess 35, which is inclined with respect to the normal direction of the deposition mask 20, are merged with each other. The connection portion 41 defines a through-portion 42 where an area of the through-hole 25 is minimum in plan view of the deposition mask 20.

As shown in FIGS. 5 to 7, the adjacent two through-holes 25 in the other side surface along the normal direction N of the deposition mask 20, i.e., in the first surface 20a of the deposition mask 20, are spaced apart from each other along the plate plane of the deposition mask 20. Namely, as in the below-described manufacturing method, when the first recesses 30 are made by etching the base member 21 from the side of the first surface 21a of the base member 21, which will correspond to the first surface 20a of the deposition mask 20, the first surface 21a of the base member 21 remains between the adjacent two first recesses 30.

Similarly, as shown in FIGS. 5 and 7, the adjacent two second recesses 35 may be spaced apart from each other along the plate plane of the deposition mask 20, on the one side along the normal direction of the deposition mask 20, i.e., on the side of the second surface 20b of the deposition mask 20. Namely, the second surface 21b of the base member 21 may remain between the adjacent two second recesses 35. In the below description, this portion of the effective area 22 of the second surface 21b of the base member 21, which is not etched and thus remains, is also referred to as a top portion 43. By producing the deposition mask 20 such that such a top portion 43 remains, the deposition mask 20 can have a sufficient strength. Thus, it can be prevented that the deposition mask 20 is damaged during conveyance, for example. However, when a width β of the top portion 43 is too large, there is a possibility that shadow occurs in the deposition step, which lowers utilization efficiency of the deposition material 98. Thus, the deposition mask 20 is preferably produced such that the width β of the top portion 43 is excessively large. For example, the width β of the top portion 43 is preferably not more than 2 μm. In general, the width β of the top portion 43 varies depending on a direction along which the deposition mask 20 is severed. For example, the width β of the top portion 43 shown in FIG. 5 and that of FIG. 7 may differ from each other. In this case, the deposition mask 30 may be formed such that the width β of the top portion 43 is not more than 2 μm, regardless of a direction along which the deposition mask 20 is severed.

As shown in FIG. 6, the etching process may be performed such that adjacent two first recesses 30 are connected to each other, depending on their positions. Namely, there may be a part where no second surface 21b of the base member 21 remains between the adjacent two second recesses 35. In addition, although not shown, the etching process may be performed such that adjacent two second recesses 35 are connected over the whole area of the second surface 21b.

When the deposition mask apparatus 10 is received in the deposition apparatus 90 as shown in FIG. 1, the first surface 20a of the deposition mask 20 faces the organic EL substrate 92, as shown by the two-dot chain lines in FIG. 5, and the second surface 20b of the deposition mask 20 is located on the side of the crucible 94 holding the deposition material 98. Thus, the deposition material 98 adheres to the organic EL substrate 92 through the second recess 35 whose opening area gradually decreases. As indicated by the arrow in FIG. 5 extending from the second surface 20b toward the first surface 20a, the deposition material 98 not only moves from the crucible 94 toward the organic EL substrate 92 along the normal direction N of the organic EL substrate 92, but also sometimes moves along a direction largely inclined with respect to the normal direction N of the organic EL substrate 92. At this time, when the thickness of the deposition mask 20 is large, most of the diagonally moving deposition material 98 reaches the wall surface 36 of the second recess 35 to adhere thereto, before the deposition material 98 passes through the through-holes 25 to reach the organic EL substrate 92. Thus, in order to improve utilization efficiency of the deposition material 98, it is considered to be preferable that the thickness t of the deposition mask 20 is reduced so that heights of the wall surface 36 of the second recess 35 and the wall surface 31 of the first recess 30 are reduced. Namely, it can be said that it is preferable that a base member 21, which has the thickness t as small as possible, as long as the strength of the deposition mask 20 is ensured, is used as the base member 21 for constituting the deposition mask 20. In consideration of this point, the thickness t of the deposition mask 20 in this embodiment is preferably set to be not more than 50 μm, e.g., not less than 5 μm and not more than 50 μm. The thickness t is a thickness of the peripheral area 23, i.e., a thickness of a part of the deposition mask 20 where the first recess 30 and the second recess 35 are not formed. Therefore, the thickness t can be said as a thickness of the base member 21.

In FIG. 5, a minimum angle defined by a line L1, which passes the connection portion 31 having the minimum opening area of the through-hole 25 and another given position of the wall surface 36 of the second recess 35, with respect to the normal direction N of the deposition mask 20 is represented by a symbol θ1. In order that the diagonally moving deposition material 98 can be caused to reach the organic EL substrate 92 with being caused to reach the wall surface 36 as much as possible, it is advantageous that the angle θ1 is increased. In order to increase the angle θ1, it is effective to reduce the aforementioned width β of the top portion 43, as well as to reduce the thickness t of the deposition mask 20.

In FIG. 7, the symbol α represents a width of a portion (hereinafter also referred to as "rib portion") of the effective area 22 of the first surface 21a of the base member 21, which is not etched and thus remains. A width α of the rib portion and a size $r_2$ of the through-portion 42 are suitably determined depending on a size of an organic EL display device and the number of display pixels. For example, the width α of the rib portion is not less than 5 μm and not more than 40 μm, and the size $r_2$ of the through-portion 42 is not less than 10 μm and not more than 60 μm.

Figure 8:
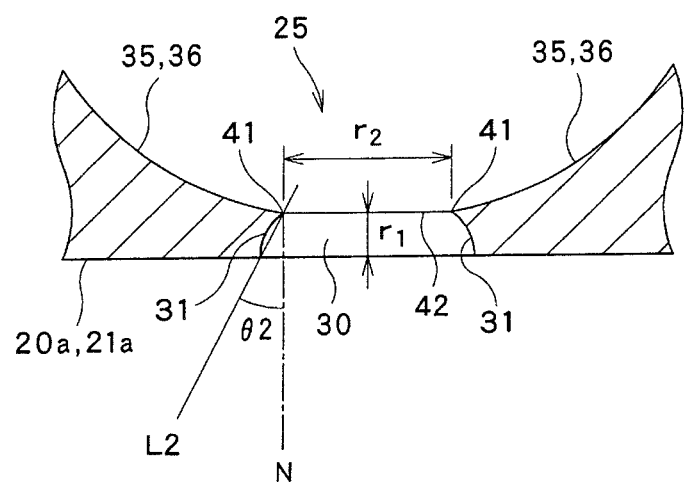
FIG. 8 is an enlarged sectional view showing the through-holes shown in FIG. 5 and an area near thereto.

Although not limited, the deposition mask 20 according to this embodiment is particularly effective when an organic EL display device having a pixel density of not less than 450 ppi is produced. Herebelow, a size example of the deposition mask 20 required for producing an organic EL display device having such a high pixel density is described. FIG. 8 is an enlarged sectional view showing the through-hole 25 of the deposition mask 20 shown in FIG. 5 and an area near thereto.

In FIG. 8, as parameters related to the shape of the through-hole 25, a distance from the first surface 20a of the deposition mask 20 up to the connection portion 41 thereof along the normal direction N of the deposition mask 20, i.e., a height of the wall surface 31 of the first recess 30 is represented by a symbol $r_1$. Further, a size of the first recess 30 in a part where the first recess 35 is connected to the second recess 35, i.e., a size of the through-portion 42 is represented by a symbol $r_2$. In addition, in FIG. 8, an angle that is defined by a line L2, which connects the connection portion 41 and a distal edge of the first recess 30 in the first surface 21a of the base member 21, with respect to the normal direction N of the base member 21 is represented by a symbol θ2.

When an organic EL display device having a pixel density of not less than 450 ppi is produced, the size $r_2$ of the through-portion 42 is preferably set to be not less than 10 μm and not more than 60 μm. Due to this size, it is possible to provide the deposition mask 20 capable of producing an organic EL display device having a high pixel density. Preferably, the height $r_1$ of the wall surface 31 of the first recess 30 is set to be not more than 6 μm.

Next, the aforementioned angle θ2 shown in FIG. 8 is described. The angle θ2 corresponds to a maximum value of an inclined angle of the deposition material 98 that can reach the organic EL substrate 92, out of the deposition material 98 that comes in an inclined manner with respect to the normal direction N of the base member 21 and passes through the through-portion 42 near the connection portion 41. This is because the deposition material 98 coming at an inclined angle greater than the angle θ2 adheres to the wall surface 31 of the first recess 30, before the deposition material 98 reaches the substrate 92. Thus, by decreasing the angle θ2, it can be prevented that the deposition material 98 coming at a large inclined angle and passing through the through-portion 42 adheres to the substrate 92. Therefore, it can be prevented that the deposition material 98 adheres to a portion of the organic EL substrate 92, which is outside a part overlapping with the through-portion 42. Namely, to decrease the angle θ2 can prevent variation in planar dimension and thickness of the deposition material 98 adhering to the organic EL substrate 92. From this point of view, the through-hole 25 is formed such that the angle θ2 is not more than 45 degrees, for example. FIG. 8 shows the example in which the size of the first recess 30 in the first surface 21a, i.e., the opening size of the through-hole 25 in the first surface 21a is larger than the size $r_2$ of the first recess 30 in the connection portion 41. Namely, the value of the angle θ2 is a positive value. However, although not shown, the size $r_2$ of the first recess 30 in the connection portion 41 may be larger than the size of the first recess 30 in the first surface 21a. Namely, the value of the angle θ2 may be a negative value.

Manufacturing Method of Deposition Mask

Next, a manufacturing method of a deposition mask 20 is described.

(Preparation of Metal Plate)

Firstly, a metal plate 64 for manufacturing a deposition mask is prepared. The metal plate 64 is prepared in the form of a roll obtained by winding an elongated metal plate. As the metal plate 64, a metal plate made of an iron alloy containing nickel is used, for example. A thickness of the metal plate 64 is 3 μm, for example, or may be not less than 5 μm or not less than 10 μm. In addition, the thickness of the metal plate 64 is not more than 50 μm, for example, or may be not more than 30 μm or not more than 20 μm. A rolling method or a plating deposition method can be employed as a method of producing the metal plate 64 having a desired thickness.

Next, a method of manufacturing the deposition mask 20 with the use of the metal plate 64 is described with reference mainly to FIGS. 9 to 22. In the below-described manufacturing method of the deposition mask 20, as shown in FIG. 9, the metal plate 64 is processed such that a plurality of deposition mask portions including the through-holes 25 are formed on the metal plate 64 (processing step), and then the deposition mask portions are separated from the metal plate 64 (separation step), so that the sheet-like deposition masks 20 can be obtained.

(Processing Step)

The step of processing the metal plate 64 includes a step of etching the elongated metal plate 64 by using a photolithographic technique to form first recesses 30 from the side of a first surface 64a of the metal plate 64, and a step of etching the metal plate 64 by using a photographic technique to form second recesses 35 from the side of a second surface 64b of the metal plate 64. By communicating the first recesses 30 and the second recesses 35 formed in the metal plate 64 to each other, the through-holes 25 are produced in the metal plate 64. In the below-described example, the step of forming the first recesses 30 is performed before the step of forming the second recesses 35, and a step of sealing the produced first recesses 30 is performed between the step of forming the first recesses 30 and the step of forming the second recesses 35. Herebelow, the respective steps are described in detail.

Figure 9:
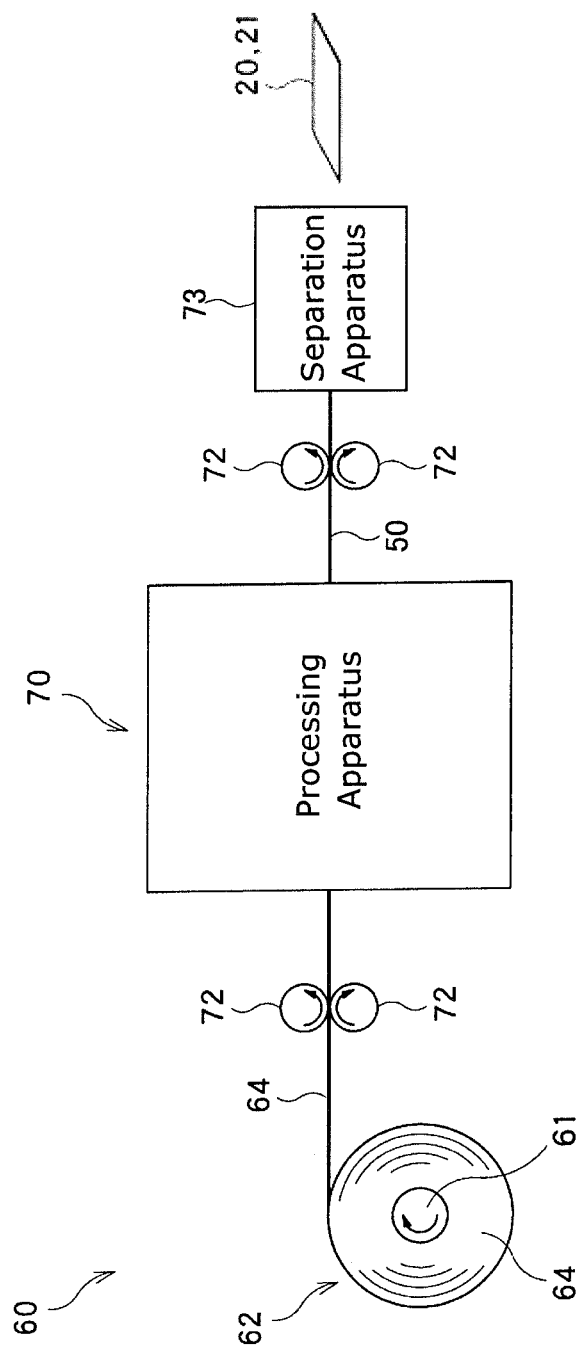
FIG. 9 is a schematic view for generally describing an example of the manufacturing method of a deposition mask.

FIG. 9 shows a manufacturing apparatus 60 for producing the deposition masks 20. As shown in FIG. 9, a roll 62 having a core 61 around which the metal plate 64 is wound is prepared. By rotating the core 61 to reel out the roll 62, the metal plate 64 extending like a strip is supplied, as shown in FIG. 9.

The supplied metal plate 64 is conveyed to a processing apparatus (etching means) 70 by a conveyor roller 72. Respective processes shown in FIGS. 10 to 17 are performed by the processing apparatus 70. In this embodiment, the plurality of depositions masks 20 is allocated in a width direction of the metal plate 64. In other words, the metal plate 64 is processed such that the below-described deposition mask portions, which will be separated from the metal plate 64 to provide the deposition masks 20, are aligned in the width direction of the metal plate 64. In this case, preferably, the plurality of deposition masks 20 are allocated to the metal plate 64 such that the direction of a long side 26 of the deposition mask portion, i.e., the deposition mask 20 corresponds to the longitudinal direction of the eloigned metal plate 64.

Figure 10:
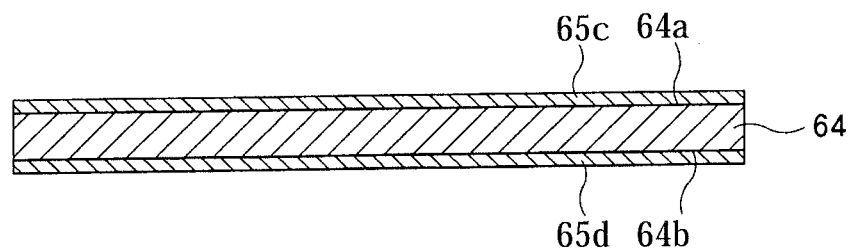
FIG. 10 is a view showing a step of forming a resist film on a metal plate.

As shown in FIG. 10, resist films 65c, 65d each containing a negative-type photosensitive resist material are firstly formed on the first surface 64a and the second surface 64b of the metal plate 64. For example, the resist films 65c, 65d are formed by applying a coating liquid containing a negative-type photosensitive resist material onto the first surface 64a and the second surface 64b of the metal plate 64, and then by drying the coating liquid.

Figure 11:
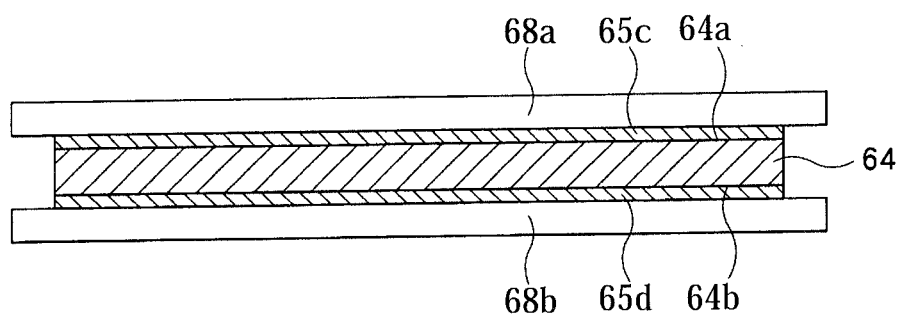
FIG. 11 is a view showing a step of bringing an exposure mask into tight contact with the resist film.

Then, exposure masks 68a, 68b, which do not allow light transmit through areas of the resist films 65c, 65d to be removed therefrom, are prepared. As shown in FIG. 11, the exposure masks 68a, 68b are located on the resist films 65c, 65d, respectively. For example, glass dry plates, which do not allow light to transmit through the areas to be removed from the resist films 65c, 65d, are used as the exposure masks 68a, 68b. Thereafter, the exposure masks 68a, 68b are sufficiently brought into tight contact with the resist films 65c, 65d by vacuum bonding.

A positive-type photosensitive resist material may be used. In this case, an exposure mask, which allows light to transmit through an area to be removed of the resist film, is used.

Figure 12:
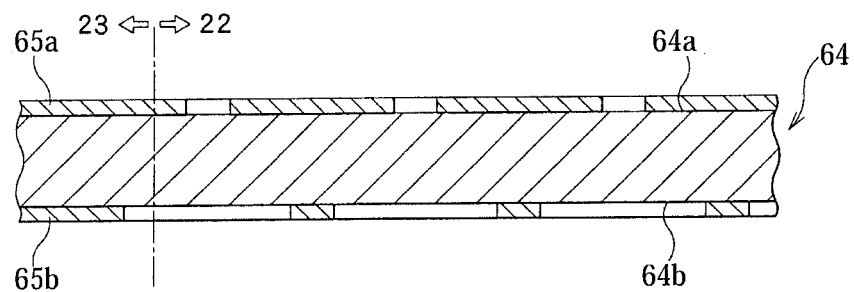
FIG. 12 is a view showing a step of developing the resist film.

Thereafter, the resist films 65c, 65d are exposed across the exposure masks 68a, 68b (exposure step). Further, in order to form an image on the exposed resist films 65c, 65d, the resist films 65c, 65d are developed (development step). Thus, as shown in FIG. 12, a first resist pattern 65a can be formed on the first surface 64a of the metal plate 64, and a second resist pattern 65b can be formed on the second surface 64b of the metal plate 64. The development step may include a resist heating step for increasing a hardness of the resist films 65c, 65d, or for more securely adhering the resist films 65c, 65d to the metal plate 64. The resist heating step can be performed at a temperature not less than a room temperature and not more than 400° C., for example.

Figure 13:
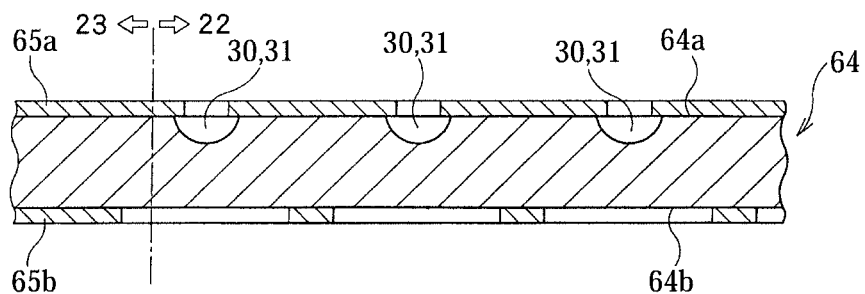
FIG. 13 is a view showing a first-surface etching step.

Then, as shown in FIG. 13, a first-surface etching step is performed, in which areas of the first surface 64a of the metal plate 64, which is not covered with the first resist pattern 65a, is etched by using a first etchant. For example, the first etchant is jetted to the first surface 64a of the metal plate 64 across the first resist pattern 65a, from a nozzle disposed on the side facing the first surface 64a of the conveyed metal plate 64. As a result, as shown in FIG. 13, the areas of the metal plate 64, which are not covered with the first resist pattern 65a, are eroded by the first etchant. Thus, the plurality of first recesses 30 are formed in the first surface 64a of the metal plate 64. The first etchant to be used is an etchant containing ferric chloride solution and hydrochloric acid, for example.

Figure 14:
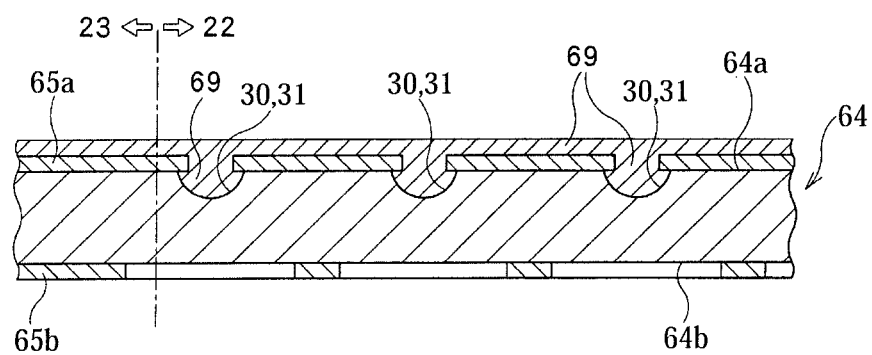
FIG. 14 is a view showing a step of coating a first recess with a resin.

Thereafter, as shown in FIG. 14, the first recesses 30 are coated with a resin 69 resistant to a second etchant that is used in a succeeding second-surface etching step. Namely, the first recesses 30 are sealed with the resin 69 resistant to the second etchant. In the example shown in FIG. 14, a film of the resin 69 is formed to cover not only the formed first recesses 30 but also the first surface 64a (first resist pattern 65a).

Figure 15:
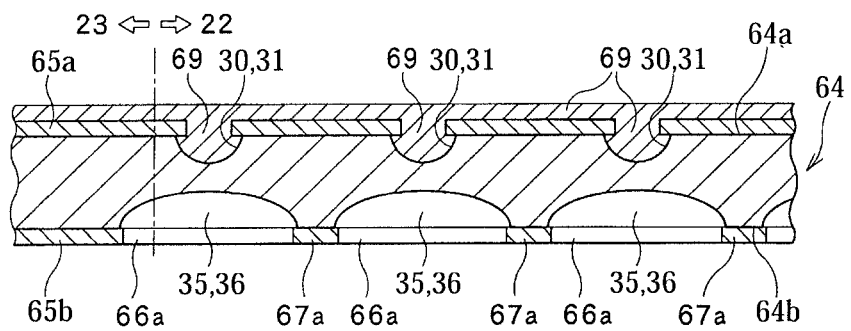
FIG. 15 is a view showing a second-surface etching step.

Then, as shown in FIG. 15, areas of the second surface 64b of the metal plate 64, which are not covered with the second resist pattern 65b, are etched so as to perform the second-surface etching step in which the second recesses 35 are formed in the second surface 64b. The second-surface etching step is performed until the first recesses 30 and the second recesses 35 are communicated with each other so that the through-holes 25 are formed. Similarly to the first etchant, the second etchant to be used is an etchant containing ferric chloride solution and hydrochloric acid, for example.

Figure 16:
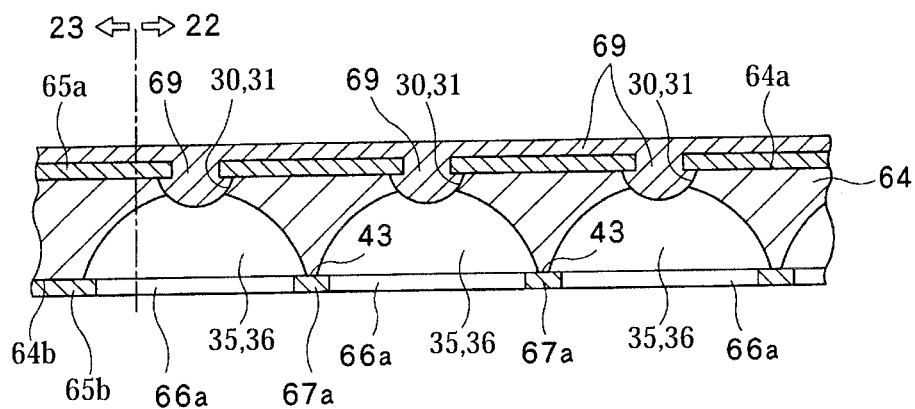
FIG. 16 is a view showing the second-surface etching step succeeding to FIG. 15.

The erosion by the second etchant develops in a part where the metal plate 64 is in contact with the second etchant. Thus, the erosion develops not only in the normal direction N (thickness direction) of the metal plate 64 but also in a direction along the plate plane of the metal plate 64. Preferably, the second-surface etching step is ended before two second recesses 35, which are respectively formed on positions facing adjacent two apertures 66a of the second resist pattern 65b, merge on the reverse to a bridge portion 67a positioned between the two apertures 66a. Thus, as shown in FIG. 16, the aforementioned top portion 43 can remain in the second surface 64b of the metal plate 64.

Figure 17:
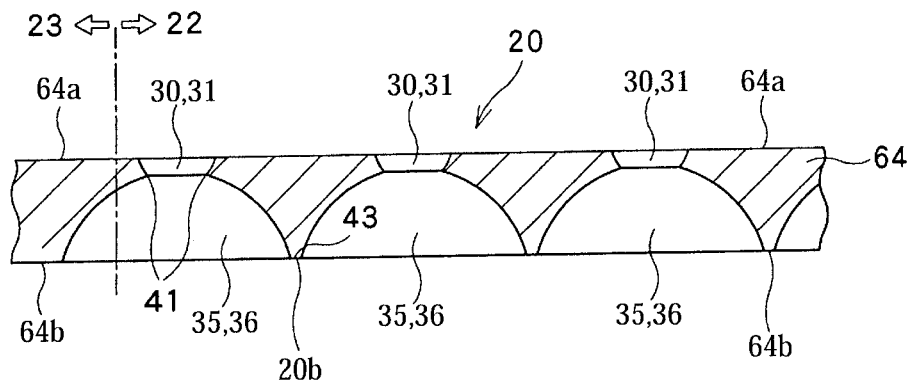
FIG. 17 is a view showing a step of removing the resin and a resist pattern from the metal plate.

Thereafter, as shown in FIG. 17, the resin 69 is removed from the metal plate 64. For example, the resin 69 can be removed by using an alkali-based peeling liquid. When the alkali-based peeling liquid is used, as shown in FIG. 17, the resist patterns 65a, 65b are removed simultaneously with the removal of the resin 69. However, after the removal of the resin 69, the resist patterns 65a, 65b may be removed separately from the resin 69.

Figure 18:
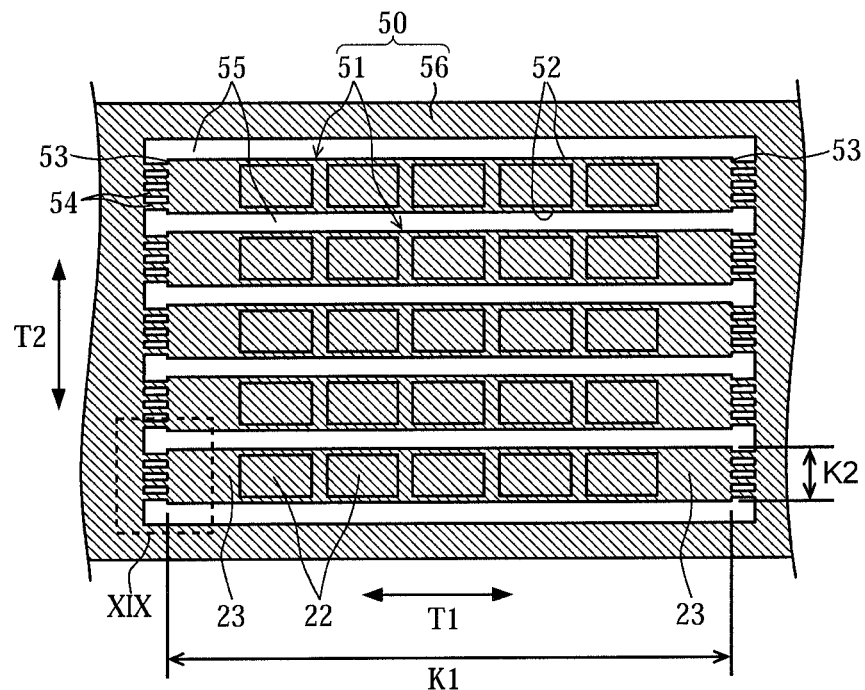
FIG. 18 is a plan view showing an intermediate product obtained by processing the metal plate.

FIG. 18 is a plan view showing an intermediate product 50 obtained by processing the deposition masks 20 to form the through-holes 25, as described above. The deposition masks 20 are allocated to the intermediate product 50. In other words, the intermediate product 50 has the plurality of deposition mask portions 51 and a support portion 56. In FIG. 81, the symbol T1 represents a conveying direction of the metal plate 64 in the manufacturing step of the deposition masks 20, and the symbol T2 represents a direction (referred to also as width direction herebelow) orthogonal to the conveying direction T1. The conveying direction T1 corresponds to the longitudinal direction of the elongated metal plate 64.

Each deposition mask portion 51 is a portion of the metal plate 64, which becomes the deposition mask 20 by separation. The deposition mask portion 51 includes a pair of long sides 52 and a pair of short sides 53, which correspond to the pair of long sides 26 and the pair of short sides 27 of the deposition mask 20. The plurality of through-holes 25 are formed in the deposition mask portion 51. For example, the deposition mask portion 51 includes the effective area 22 having the plurality of through-holes 25 formed therein, and the surrounding area 23 around the effective area 22.

As shown in FIG. 18, the plurality of deposition mask portions 51 are aligned in a direction intersecting with the long side 52. For example, the long side 52 is parallel to the conveying direction T1, and the direction in which the deposition mask portions 51 are aligned is parallel to the width direction T2.

The support portion 56 is a portion that surrounds the plurality of deposition mask portions 51 in a plan view, and is partially connected to the deposition mask portions 51. In the example shown in FIG. 18, the support portion 56 is a portion of the metal plate 64, which is other than the deposition mask portions 51.

Figure 19:
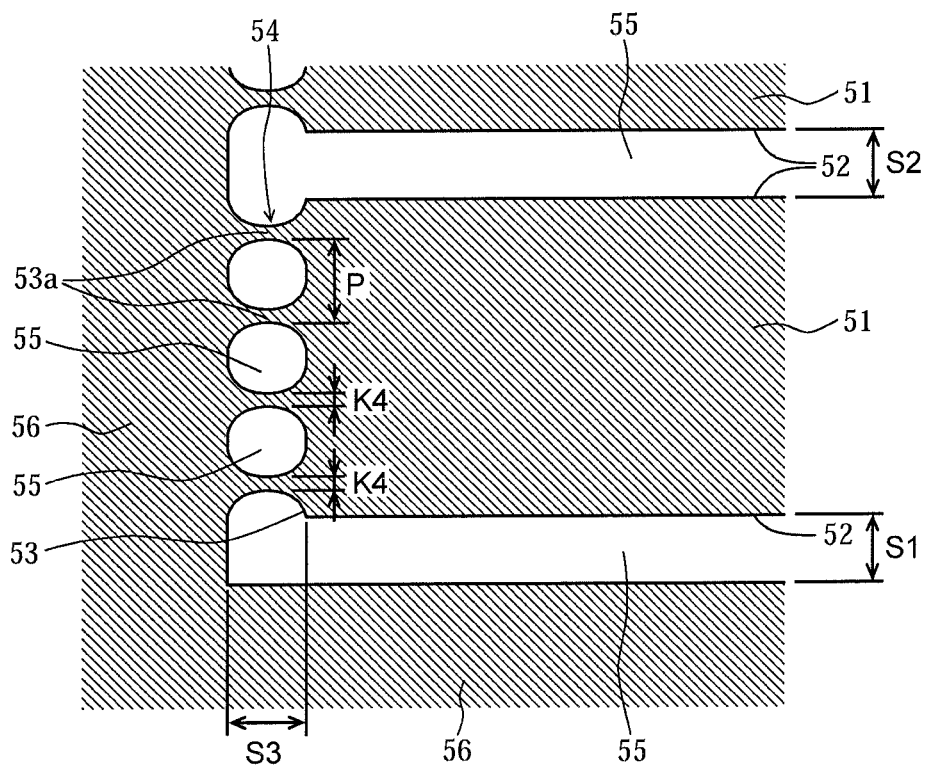
FIG. 19 is an enlarged view showing an area of the intermediate product of FIG. 18, which is surrounded by dotted lines indicated by the symbol XIX.

Herebelow, a connection part 54 between the deposition mask portion 51 and the support portion 56 is described. FIG. 19 is an enlarged view showing an area of the intermediate product 50 of FIG. 18, which is surrounded by dotted lines indicated by the symbol XIX. In the example shown in FIGS. 18 and 19, the short side 53 of the deposition mask portion 51 is partially connected to the support portion 56. For example, as shown in FIG. 19, the short side 53 of the deposition mask portion 51 includes a plurality of projections 53a projecting toward the support portion 56 so as to be connected to the support portion 56. On the other hand, the long side 52 of the deposition mask portion 51 is not connected to the support portion 56. In other words, between the long side 52 of the deposition mask portion 51 and the support portion 56, there is a gap 55 over the entire area of the long side 52. In addition, no support portion 56 exists between the long sides 52 of the adjacent two deposition mask portions 51. In other words, between the long sides 52 of the adjacent two deposition mask portions 51, there is the gap 55 over the entire area of each long side 52.

The gap 55 can be formed simultaneously with the through-holes 25 in the aforementioned processing step. For example, in the above processing step, the resist films 65c, 65d are exposed and developed such that no resist patterns 65a, 65b remains on a portion of the metal plate 64 where the gap 55 is to be formed. Then, the areas of the metal plate 64, which are not covered with the resist patterns 65a, 65b, are removed by etching. Thus, the gap 55 shown in FIGS. 18 and 19 can be formed on the metal plate 64 simultaneously with the plurality of through-holes 25.

The etching for forming the gap 55 may be performed on both sides of the first surface 64a and the second surface 64b of the metal plate 64 (case 1), or may be performed only on one side of the first surface 64a and the second surface 64b of the metal plate 64 (case 2).

In the case 1, the resist film 65c is exposed and developed such that no resist pattern 65a remains on a portion of the first surface 64a of the metal plate 64, where the gap 55 is to be formed (referred to also as possible gap portion herebelow). In addition, the resist film 65d is exposed and developed such that no resist pattern 65b remains on the possible gap portion of the second surface 64b of the metal plate 64. Then, the metal plate 64 is etched from the side of the first surface 64a. Thus, the first recesses 30 are formed in a portion of the first surface 64a of the metal plate 64, which will become the effective area 22 of the deposition mask 20. Simultaneously therewith, the first recesses 30 are formed in the possible gap portion of the first surface 64a. Then, the first recesses 30 are coated with the resin 69. Thereafter, the metal plate 64 is etched from the side of the second surface 64b of the metal plate 64. Thus, the second recesses 35 are formed in a portion of the second surface 64b of the metal plate 64, which will become the effective area 22 of the deposition mask. Simultaneously therewith, the second recesses 35 are formed in the possible gap portion of the second surface 64b. Thus, the gap 55 can be formed simultaneously with the through-holes 25.

In the case 2, the resist film 65d is exposed and developed such that no resist pattern 65b remains on the possible gap portion of the second surface 64b of the metal plate 64. On the other hand, the resist film 65c is exposed and developed such that the resist pattern 65a remains on the possible gap portion of the first surface 64a of the metal plate 64. Following thereto, the metal plate 64 is etched from the side of the first surface 64a of the metal plate 64, so that the first recesses 30 are formed in a portion of the metal plate 64, which will become the effective area 22 of the deposition mask 20. At this time, no first recess 30 is formed in the possible gap portion of the first surface 64a. Then, the first recesses 30 are coated with the resin 69. At this time, the possible gap portion of the second surface 64a is coated with the resin 69. Thereafter, the metal plate 64 is etched from the side of the second surface 64b. Thus, the second recesses 35 are formed in a portion of the second surface 64b of the metal plate 64, which will become the effective area 22 of the deposition mask. Simultaneously therewith, the second recesses 35 are formed in the possible gap portion of the second surface 64b. At this time, the etching is performed such that the second recesses 35 reach the first surface 64a, whereby the gap 55 can be formed on the possible gap portion.

In the case 2, during the first etching step for forming the first recesses 30, the possible gap portion of the first surface 64a of the metal plate 64 is not subjected to the half etching. Thus, even when the metal plate 64 has a small thickness, it can be restrained that the possible gap portion of the metal plate 64 cracks after the first etching step.

The size of the gap 55 is set such that the deposition mask portion 51 does not come into contact with the support portion 56 and other deposition mask portions 51, when the intermediate product 50 is conveyed. A size S1 of the gap 55 in the width direction T2, which is between the deposition mask portion 51 and the support portion 56, is not less than 0.1 mm and not more than 5 mm, for example. In addition, a size of S2 of the gap 55 in the width direction T2, which is between the adjacent two deposition mask portions 51 is not less than 0.1 mm and not more than 5 mm, for example. In addition, a size S3 of the gap 55 in the conveying direction T1, which is between the short side 53 of the deposition mask portion 51 and the support portion 56, is not less than 30 µm and not more than 100 µm, for example. In addition, a pitch P between the projections 53a in the direction of the short side 53 is not less than 200 µm and not more than 400 µm, for example.

(Separation Step)

Following thereto, the separation step is performed, in which the deposition mask portions 51 of the aforementioned intermediate product 50 are separated from the support portion 56 thereof. As shown in FIG. 9, the intermediate product 50 obtained by processing the metal plate 64 is firstly conveyed to a separation apparatus 73 for performing the separation step. For example, the intermediate product 50 is conveyed to the separation apparatus 73 by the conveyor rollers 72, 72 that are rotated with sandwiching the intermediate product 50 therebetween. As described above, in the intermediate product 50, when the long side 52 of the deposition mask portion 51 is not connected to the support portion 56, it is considered that the deposition mask portion 51 tends to shake and/or warp. In consideration of this point, the intermediate product 50, the conveyor rollers 72 or a conveyor path may be equipped with means for restraining shaking and/or warping of the deposition mask portions 51. For example, the restraint means include a pair of films disposed on the first surface side and the second surface side of the intermediate product 50. Since the intermediate product 50 is conveyed to the separation apparatus 73 with the intermediate product 50 being sandwiched between the pair of films, shaking and/or warping of the deposition mask portion 51 can be restrained.

Figure 20:
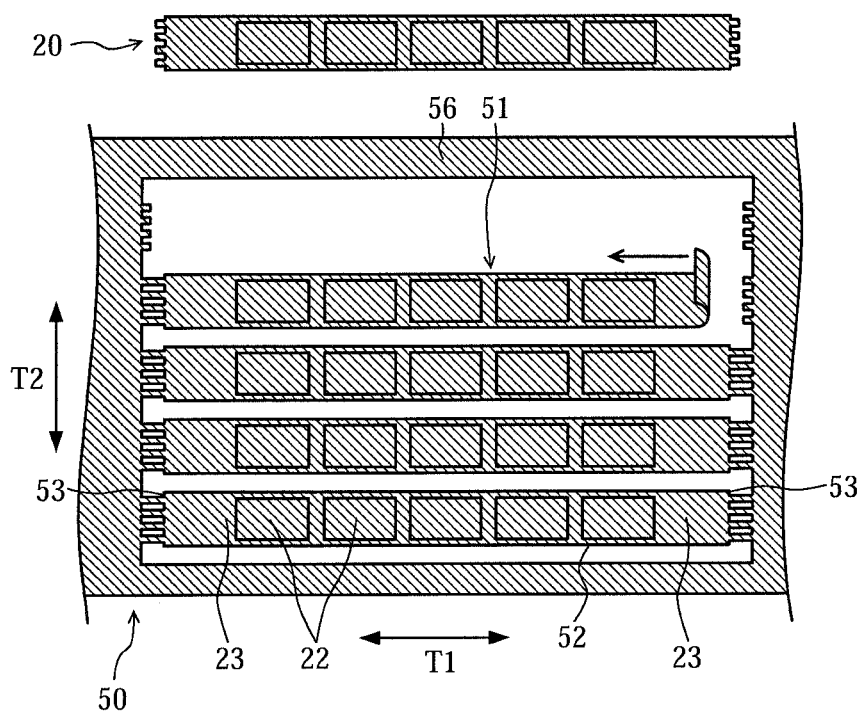
FIG. 20 is a view showing a step of separating a deposition mask portion from a support portion.
Figure 21:
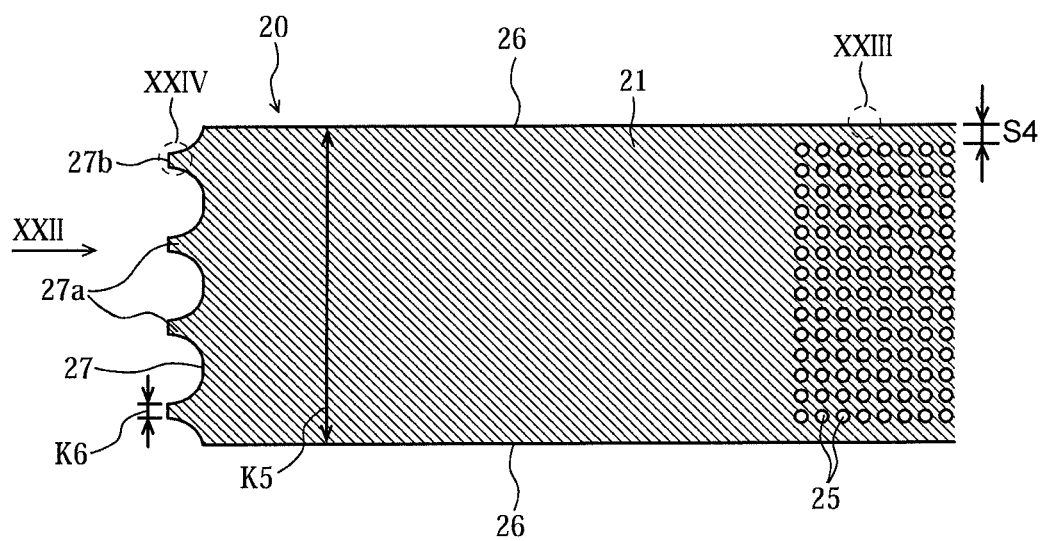
FIG. 21 is an enlarged plan view showing of a deposition mask obtained from the intermediate product.

FIG. 20 is a view showing the separation step of separating the deposition mask portions 51 from the support portion 56. As described above, the long side 52 of the deposition mask portion 51 and the support portion 56 are not connected. Thus, by breaking the connection part 54 between the short side 53 of the deposition mask portion 51 and the support portion 56, the deposition mask portion 51 can be separated from the support portion 56 to obtain the deposition mask 20. FIG. 21 is an enlarged plan view showing the deposition mask 20 obtained from the intermediate product 50.

Figure 22:
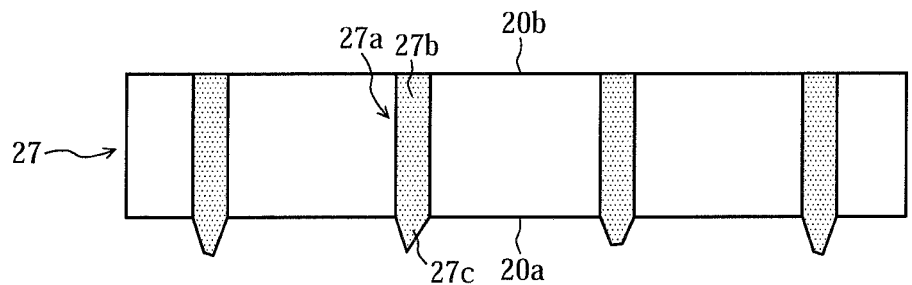
FIG. 22 is a side view showing a short side of the deposition mask of FIG. 21, which is seen from a direction indicated by the arrow XXII.

The separation step includes, for example, a breaking step in which the connection part 54 of the short side 53 of the deposition mask portion 51, which is connected to the support portion 56. In this case, as shown in FIG. 21, a part of the deposition mask 20 at which the connection part 54 is broken, e.g., distal ends of the projections 53a of the short side 53 become broken-out surfaces 27b. Thus, the short side 27 of the deposition mask 20 partially has the broken-out surfaces 27b. FIG. 22 is a side view showing the broken-out surfaces 27b of the projections 27a of the short side 27 of the deposition mask 20, seen from the direction of the arrow XXII of FIG. 21.

In the breaking step, by pulling the deposition mask portion 51 upward in FIG. 22 with respect to the support portion 56, the connection part 54 between the short side 53 of the deposition mask portion 51 and the support portion 56 is broken. In this case, as shown in FIG. 22, the broken-out surface 27b of the projection 27 may have a burr 27c caused by a force exerted from the support portion 56 upon breakage. The burr 27c extends toward a direction (downward direction in FIG. 22) of the force exerted from the support portion 56 upon breakage. The broken-out surface 27b can be defined as a surface having such a burr 27c. On the other hand, since the long side 52 of the deposition mask portion 51 is not connected to the support portion 56, the long side 26 of the deposition mask 20 has no broken-out surface.

Figure 23A:
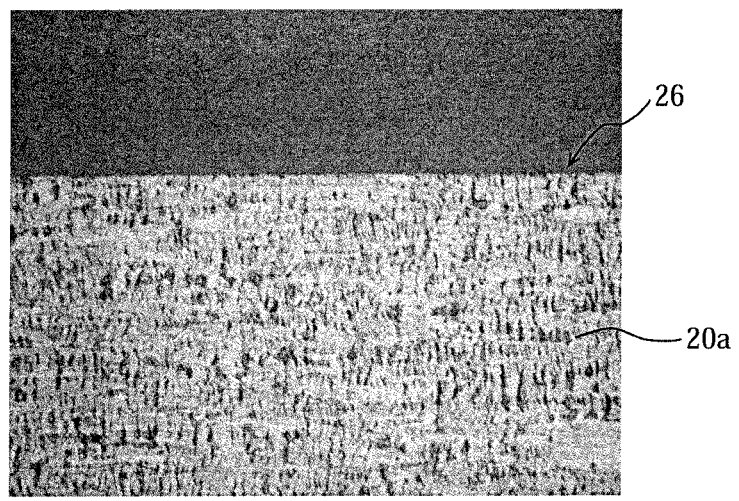
FIG. 23A is a view showing a result of an area of the deposition mask of FIG. 21, which is surrounded by dotted lines indicated by the symbol XXIII, the area being observed from the first surface side.
Figure 23B:
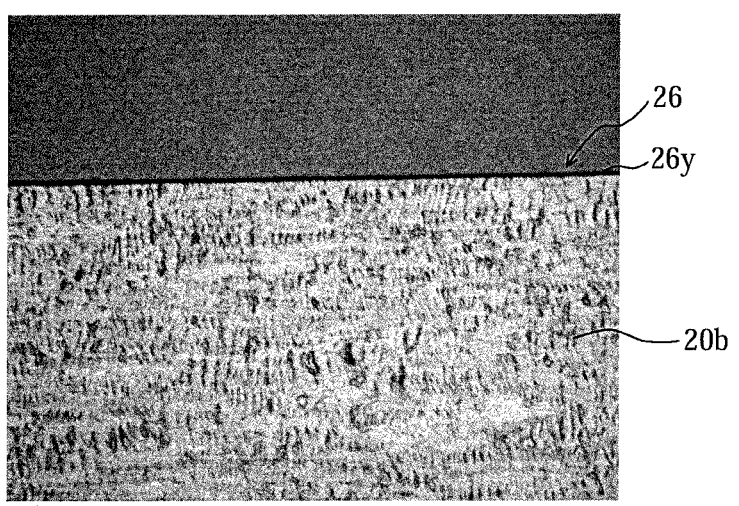
FIG. 23B is a view showing a result of the area of the deposition mask of FIG. 21, which is indicated by the symbol XXIII, the area being observed from the second surface side.
Figure 24A:
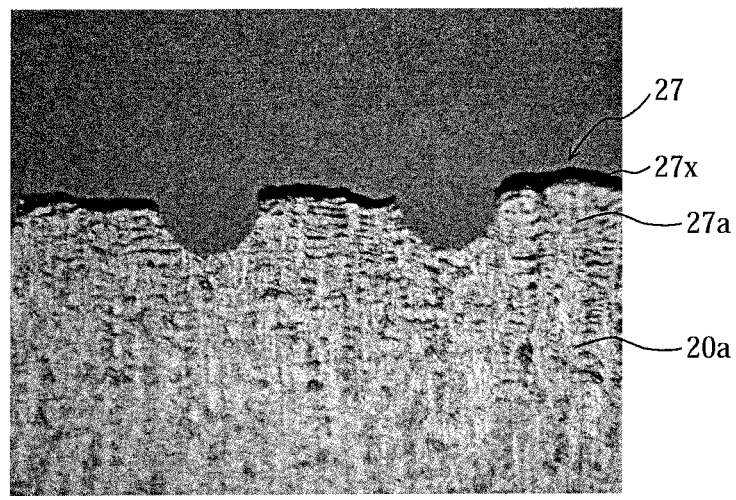
FIG. 24A is a view showing a result of an area of the deposition mask of FIG. 21, which is surrounded by dotted lines indicated by the symbol XXIV, the area being observed from the first surface side.
Figure 24B:
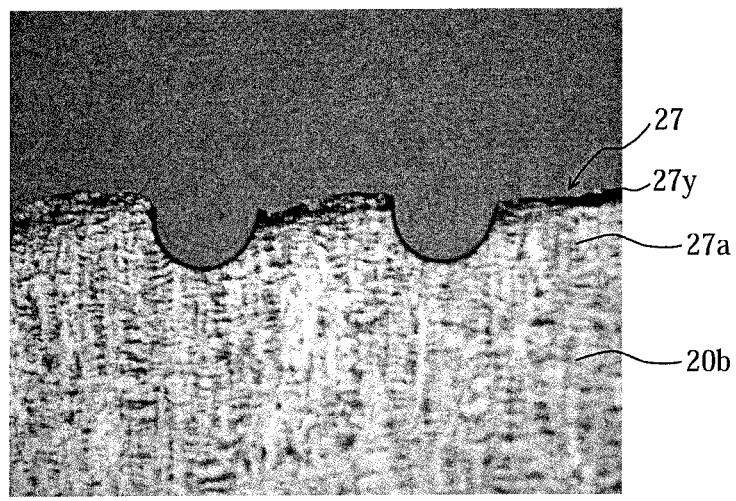
FIG. 24B is a view showing a result of an area of the deposition mask of FIG. 21, which is surrounded by dotted lines indicated by the symbol XXIV, the area being observed from the second surface side.

FIGS. 23A and 23B are views showing results of an area of the long side 26 of the deposition mask 20 of FIG. 22, which is surrounded by the dotted lines indicated by the symbol XXIII, the area being observed from the side of the first surface 20a and from the second surface 20b, respectively. In addition, FIGS. 24A and 24B are views showing results of an area of the short side 27 of the deposition mask 20 of FIG. 22, which is surrounded by the dotted lines indicated by the symbol XXIII, the area being observed from the side of the first surface 20a and from the second surface 20b, respectively. In FIGS. 23A, 23B, 24A and 24B, a magnification upon observation is 10 times.

As shown in FIG. 24A, a portion which looked black (referred to also as dark portion) 27x was observed at the distal end of the projection 27a of the short side 27. The width of the dark portion 27x was 13.8 µm. As shown in FIG. 24B, when observed from the side of the second surface 20b of the deposition mask 20, a similar dark portion 27y was confirmed.

On the other hand, in the area of the long side 26, no dark portion was observed, or a dark portion having a thickness smaller than that of the short side 27 was confirmed. For example, as shown in FIG. 23B, when seen from the side of the second surface 20b, the dark portion 26y having a thickness of 5.1 µm was confirmed.

Figure 25A:
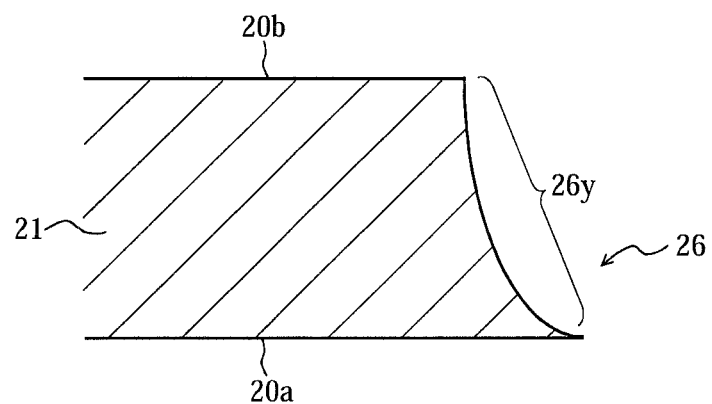
FIG. 25A is a sectional view schematically showing an area of the deposition mask of FIG. 21, which is surrounded by dotted lines indicated by the symbol XXIII.
Figure 25B:
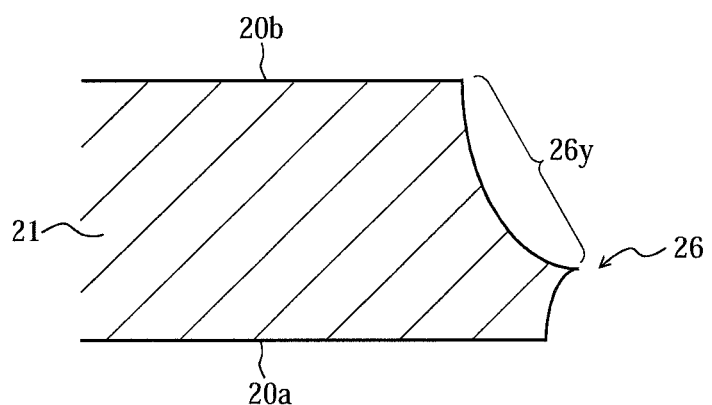
FIG. 25B is a view showing a modification example of a sectional shape of a long side of the deposition mask.

FIG. 25A is a view schematically showing an area of the deposition mask 20 of FIG. 22, which is surrounded by the dotted lines indicated by the symbol XXIII, i.e., a sectional shape of the long side 26 of the deposition mask 20. In addition, FIG. 25B is a view showing a modification example of the sectional shape of the long side 26. As shown in FIGS. 25A and 25B, the long side 26 of the deposition mask 20 may have a curved surface having an inwardly projecting shape, which is cased by the side etching performed when the etching step for forming the through-holes 25. FIG. 25A is a view showing an example of the sectional shape of the long side 26, when the gap 55 is formed by etching from only the second surface 64b of the metal plate 64. In addition, FIG. 25A is a view showing an example of the sectional shape of the long side 26, when the gap 55 is formed by etching from both the first surface 64a and the second surface 64b of the metal plate 64. The sectional shape corresponding to the top pictures shown in FIGS. 23A and 23B is FIG. 25A.

When the gap 55 is formed by etching only from the second surface 64b of the metal plate 64, as shown in FIG. 25A, a curved surface, which extends outside from the side of the second surface 20b toward the first surface 20a, is formed on the long side 26. This curved surface is recognized when the long side 26 is observed from the side of the second surface 20b, but is not recognized when the long side 26 is observed from the side of the first surface 20a. In other words, the long side 26 has a sectional shape that projects most outside at a part meeting the first surface 20a. The dark portion 26y, which was confirmed when the long side 26 was observed from the side of the second surface 20b, is considered to be caused by scattering of light in the curved surface.

When the gap 55 is formed by etching both from the first surface 64a and the second surface 64b of the metal plate, as shown in FIG. 25B, a curved surface caused by the side etching when the first recesses 30 are formed, which is located on the side of the first surface 20a, and a curved surface caused by the side etching when the second recesses 35 are formed, which is located on the side of the second surface 20b, are formed on the long side 26. In this case, the long side 26 has a sectional shape that projects most outside at a part where the curved surface on the side of the first surface 20a and the curved surface on the side of the second surface 20b meet. Since the size of the second recess 35 on the side of the second surface 20b is larger than the size of the first recess 30 on the side of the first surface 20a (see FIGS. 5 to 7), the degree of side etching is larger on the side of the second surface 20b. Thus, the curved surface of the long side 26 on the side of the second surface 20b is larger. As a result, the width of the dark portion, which is confirmed when the long side 26 is observed from the side of the second surface 20b, is considered to be larger than the width of the dark portion, which is confirmed when the long side 26 is observed from the side of the first surface 20a.

Figure 25C:
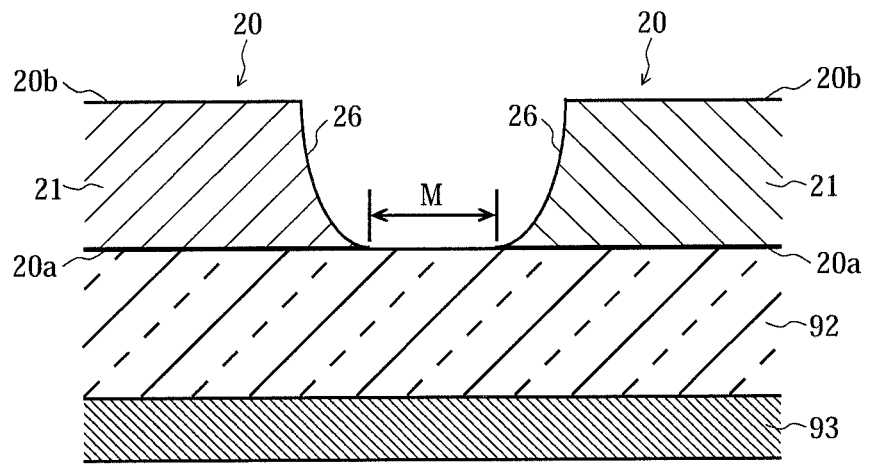
FIG. 25C is a view showing a state in which the deposition mask including the long side having the sectional shape shown in FIG. 25A faces an organic EL substrate.
Figure 25D:
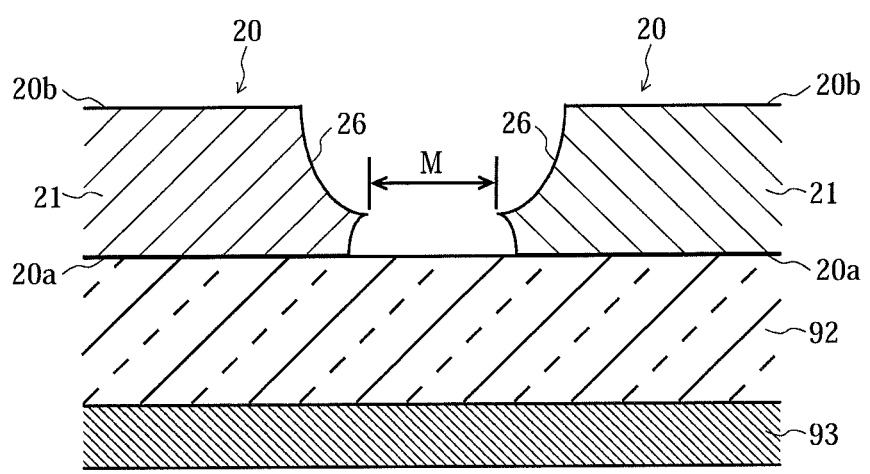
FIG. 25D is a view showing a state in which the deposition mask including the long side having the sectional shape shown in FIG. 25B faces an organic EL substrate.

FIG. 25C is a view showing a state in which the deposition mask 20 including the long side 26 having the sectional shape shown in FIG. 25A faces the organic EL substrate 92. In addition, FIG. 25D is a view showing a state in which the deposition mask 20 including the long side 26 having the sectional shape shown in FIG. 25B faces the organic EL substrate 92. In the examples shown in FIGS. 25C and 25D, the plurality of deposition masks 20 are arranged with a predetermined space M therebetween in the direction of the short side 27. The space M is set to be not less than a predetermined distance in order to prevent that the long sides 26 of the adjacent two deposition masks 20 are not in contact with each other. The space M is a space between the portions of the long sides 26 of the adjacent two deposition masks 20, the portions most projecting outside. In the example shown in FIG. 25C, the deposition masks 20 are arranged such that the space M at a part meeting the first surface 20a is not less than the predetermined distance. In the example shown in FIG. 25D, the deposition masks 20 are arranged such that the space M at a part where the curved surface of the long side 26 on the side of the first surface 20a and the curved surface thereof on the side of the second surface 20b meet is not less than the predetermined distance.

When the examples shown in FIGS. 25C and 25D are compared to each other, it is found that the example shown in FIG. 25C has a larger area in contact with the organic EL substrate 92. Thus, the example shown in FIG. 25C is more advantageous in terms of contact with the organic EL substrate 92.

In the example shown in FIG. 25D, if the area of the first surface 20a of the deposition mask 20 in contact with the organic EL substrate 92 is made equivalent to the example shown in FIG. 25C, the distance between the long sides 26 of the adjacent two deposition masks 20 becomes smaller, which increases the risk that the deposition masks 20 are brought into contact with each other.

Namely, the improvement of contact with the organic EL substrate 92 and the risk reduction of contact between the adjacent two deposition masks 20 are in a trade-off relationship. According to the example shown in FIG. 25C, the two requirements in the trade-off relationship can be achieved more satisfactorily than the example shown in FIG. 25D.

When the deposition masks 20 are brought into contact with each other, the deposition masks 20 may be damaged and/or deformed. When the deposition mask 20 is deformed, the area of the first surface 20a of the deposition mask 20 in contact with the organic EL substrate 92 decreases, so that the contact with the organic EL substrate 92 lowers. Thus, excessive reduction of the distance between the adjacent two deposition masks 20 may result in decrease of the contact with the organic EL substrate 92.

Figure 26:
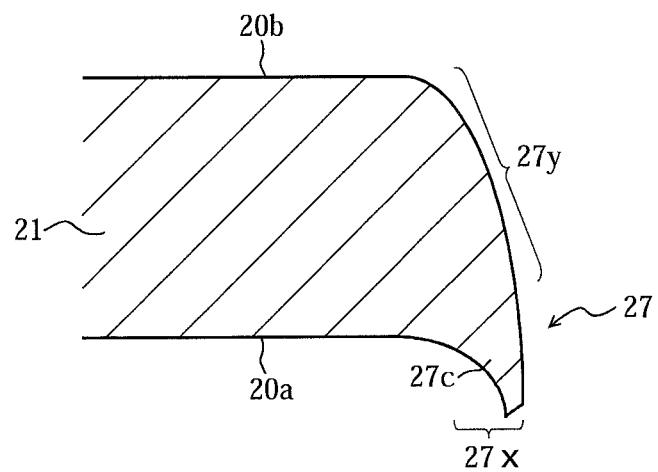
FIG. 26 is a sectional view schematically showing an area of the deposition mask of FIG. 21, which is surrounded by dotted lines indicated by the symbol XXIV.

FIG. 26 is a sectional view schematically showing an area of the deposition mask of FIG. 22, which is surrounded by dotted lines indicated by the symbol XXIV. As shown in FIG. 26, there is a possibility that a curved surface having an outwardly projecting shape is formed on the short side 27 of the deposition mask 20 on the side of the second surface 20b, which is caused by the fact that the short side 27 is pulled from the support portion 56 toward the first surface 20a during the aforementioned breaking step. The dark portion 27y, which was confirmed when the short side 27 was observed from the side of the second surface 20b, is considered to be caused by scattering of light in the curved surface. In addition, the burr 27 projecting from the first surface 20a may be formed on the side of the first surface 20a. The dark portion 27x, which was confirmed when the short side 27 was observed from the side of the first surface 20a, is considered to be caused by scattering of light in the burr 27c.

Effect of Embodiment

A minimum distance S4 (see FIG. 21) in the plane direction of the base member 21, which is from the long side 26 of the deposition mask 20 up to the through-holes 25, is generally smaller than a minimum distance in the plane direction of the base member 21, which is from the short side 27 up to the through-holes 25. Thus, when the long side 26 is deformed to have a wavelike shape, for example, a dimensional precision and/or positional precision of the deposition material adhering to the organic EL substrate 92 through the through-holes 25 positioned near to the long side 26 lower. In this embodiment, the deposition mask portions 51 of the intermediate product 50 are not connected to the support portion 56. Thus, in the separation step of separating the deposition mask portion 51 from the support portion 56, the long side 52 is not subjected to a force from the support portion 56. Thus, it can be restrained that the long side 26 is deformed to have a wavelike shape, for example. As a result, it is possible to adhere the deposition material 98 to the organic EL substrate 29, with excellent dimensional precision and/or positional precision.

The above-described embodiment can be variously modified. Hereinbelow, a modification example is described with reference to the drawings according to need. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

(Modification Example of Connection and Broken-Out Surface)

In the above-described embodiment, the entire area of the long side 52 of the deposition mask portion 51 of the intermediate product 50 is not connected to the support portion 56. However, not limited thereto, the long side 52 of the deposition mask portion 51 of the intermediate product 50 may be connected to the support portion 56, as long as the positional precision of the through-holes 25 is not affected. For example, the long side 52 may be connected to the support portion 56 in an area of the long side 52, which is not overlapped with the through-holes 25 when the long side 52 is seen along the width direction T2 of the intermediate product 50. In other words, it is preferable that an area of the long side 52 of the deposition mask portion 51, which is at least overlapped with the through-holes 25 when the long side 52 is seen along the width direction T2 of the intermediate product 50, is not connected to the support portion 56. In this case, there is no broken-out surface in the area that is overlapped with the through-holes 25 when the long side 26 is seen in the width direction of the deposition mask 20. In other words, there may be a broken-out surface in an area that is not overlapped with the through-holes 25 when the long side 26 is seen in the width direction of the deposition mask 20. Since the area of the long side 52 of the deposition mask portion 51, which is overlapped with the through-holes 25 in the width direction T2, is not connected to the support portion 56, it is possible to restrain that deformation occurring in the deposition mask portion 15 when the deposition mask portion 51 is separated from the support portion 56 affects the positional precision of the through-holes 25.

Preferably, in the intermediate product 50, a ratio of a part of the long side 52 of the deposition mask portion 51, which is connected to the support portion 56, is smaller than a ratio of a part of the short side 53 of the deposition mask portion 51, which is connected to the support portion 56. Due to this, it is possible to restrain that the precision of the deposition step is lowered because of the deformation of the long side 52 upon breakage. In this case, in the deposition mask 20 obtained by the separation step, a ratio of the broken-out surface in the long side 26 is smaller than a ratio of the broken-out surface in the short side 27.

The ratio of the part of the short side 53 of the deposition mask portion 51, which is connected to the support portion 56, can be calculated by, for example, dividing a sum of widths K4 of portions of the short side 53, which are connected to the support portion 56, by a length K2 (see FIG. 18) of the short side 53. As shown in FIG. 19, for example, the width K4 is a width of the narrowest portion of the projection 53a connected to the support portion 56. Similarly, the ratio of the part of the long side 52 of the deposition mask 51, which is connected to the support portion 56, can be calculated by, for example, a sum of widths of portions of the long side 52, which are connected to the support portion 56, by a length K1 (see FIG. 18) of the long side 52.

In addition, the ratio of the broken-out surfaces 27b in the short side 27 of the deposition mask 20 can be calculated by, for example, dividing a sum of widths K6 (see FIG. 21) of the broken-out surfaces 27b present in the short side 27, by a length K5 (see FIG. 21) of the short side 27. Similarly, the ratio of the broken-out surfaces in the long side 26 of the deposition mask 20 can be calculated by, for example, dividing a sum of widths of the broken-out surfaces present in the long side 26 by the length of the long side 26.

Alternatively, the ratio of the part of the short side 53 of the deposition mask portion 51, which is connected to the support portion 56, may be calculated by dividing the number of portions of the short side 53, which are connected to the support portion 56, by the length K2 of the short side 53. In the example shown in FIG. 19, the number of portions of the short side 53, which are connected to the support portion 56, is four. Similarly, the ratio of the part of the long side 52 of the deposition mask portion 51, which is connected to the support portion 56, may be calculated by dividing the number of portions of the long side 52, which are connected to the support portion 56, by the length K1 of the long side 52.

Similarly, the ratio of the broken-out surfaces 27 in the short side 27 of the deposition mask 20 may be calculated by dividing the number of broken-out surfaces 27b present in the short side 27 by the length K5 of the short side 27. Similarly, the ratio of the broken-out surfaces in the long side 26 of the deposition mask 20 may be calculated by dividing the number of broken-out surfaces present in the long side 26 by the length of the long side 26.

(Modification Example of Support Portion)

Figure 27:
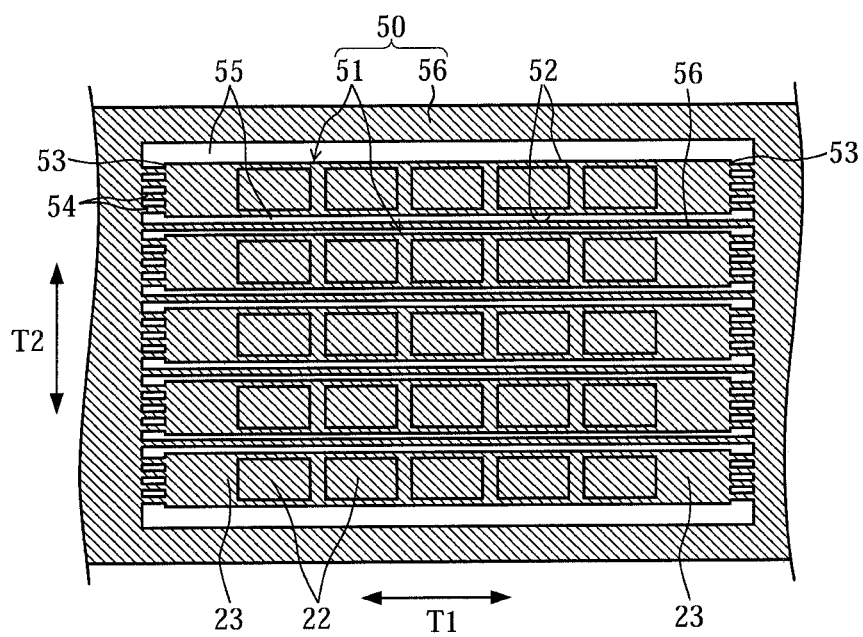
FIG. 27 is a plan view showing a modification example of the intermediate product.

In the above-described embodiment, the example in which no support portion 56 is present between the long sides 52 of the adjacent two deposition mask portions 51 is shown. However, not limited thereto, as shown in FIG. 27, between the long sides 52 of the adjacent two deposition mask portions 51, there may be present the support portion 56 that extends in the conveying direction T1 and is not connected to the long sides 52 of the deposition mask portions 51.

DESCRIPTION OF REFERENCE NUMERALS

10 Deposition mask apparatus
15 Frame
20 Deposition mask
21 Base member
22 Effective area
23 Surrounding area
25 Through-hole
26 Long side
27 Short side
27a Projection
27b Broken-out surface
27c Burr
30 First recess
31 Wall surface
35 Second recess
36 Wall surface
41 Connection portion
43 Top portion
50 Intermediate product
51 Deposition mask portion
52 Long side
53 Short side
53a Projection
54 Connection part
55 Gap
56 Support portion
64 Metal plate
65a First resist pattern
65b Second resist pattern
65c First resist film
65d Second resist film
70 Processing apparatus
72 Conveyor roller
73 Separation apparatus
90 Deposition apparatus
92 Organic EL substrate
98 Deposition material

What is claimed is:

1. An intermediate product including a metal plate into which a deposition mask including a pair of long sides and a pair of short sides, and having a plurality of through-holes formed therein is allocated, the intermediate product comprising:
   a deposition mask portion including a pair of long sides, a pair of short sides and effective areas arranged along the long sides; and
   a support portion that surrounds the deposition mask portion, and is partially connected to the short sides of the deposition mask portion;
   wherein the effective areas include through-holes formed therein, one effective area corresponding to a full display of one organic EL display device,
   wherein the long sides of the deposition mask portion are not connected to the support portion,
   wherein a plurality of the deposition mask portions are aligned in a width direction orthogonal to the long sides,
   wherein a single gap is formed between the long sides of two adjacent deposition mask portions over the entire length of each long side, and
   wherein the long sides of the two adjacent deposition mask portions directly face each other across the gap.

2. The intermediate product according to claim 1, wherein the short side of the deposition mask portion includes a plurality of projections projecting toward the support portion so as to be connected to the support portion.

3. The intermediate product according to claim 1, wherein thicknesses of the deposition mask portion and the support portion are not more than 50 μm.

4. The intermediate product according to claim 1, wherein the deposition mask portion further comprises surrounding areas arranged along the long sides, the through-holes within each effective area are arranged at a pitch, and each surrounding area does not include any through-holes and has a size larger than said pitch along a direction of the long sides.

5. The intermediate product according to claim 1, wherein the size of the gap in the width direction is not less than 0.1 mm and not more than 5 mm.

6. A deposition mask comprising:
   a base member made of metal, the base member including a pair of long sides and a pair of short sides; and
   effective areas arranged along the long sides;
   wherein the effective areas include through-holes formed therein, one effective area corresponding to a full display of one organic EL display device,
   wherein a broken-out surface exists on the short side of the base member, while no broken-out surface exists on the long side of the base member,
   wherein the base member has a first surface that faces a substrate to which a deposition material having passed through the through-holes adheres, and a second surface positioned opposite to the first surface,
   wherein the through-holes include first recesses formed in the first surface, and second recesses formed in the second surface and connected to the first recesses,
   wherein the size of each of the first recesses is smaller than the size of each of the second recesses in plan view, and
   wherein the long side of the base member has a sectional shape that projects most outwardly at a portion thereof that meets the first surface.

7. The deposition mask according to claim 6, wherein the short side of the base member includes a plurality of projections each projecting outward and having the broken-out surface.

8. The deposition mask according to claim 6, wherein a minimum distance from the long side of the base member up to the through-holes in a plane direction of the base member is not more than 50 μm.

9. The deposition mask according to claim 6, wherein a thickness of the base member is not more than 50 μm.

10. A deposition mask apparatus comprising:
the deposition mask according to claim 6; and
a frame supporting the deposition mask;
wherein the short side of the deposition mask is welded to the frame.

11. The deposition mask according to claim 6, further comprising surrounding areas arranged along the long sides, the through-holes within each effective area are arranged at a pitch, and each surrounding area does not include any through-holes and has a size larger than said pitch along a direction of the long sides.

* * * * *